US012040425B2

(12) United States Patent
Cho et al.

(10) Patent No.: US 12,040,425 B2
(45) Date of Patent: Jul. 16, 2024

(54) SELF-ALIGNED DISPLAY APPARTUS

(71) Applicant: SAMSUNG DISPLAY CO., LTD., Yongin-si (KR)

(72) Inventors: Hyunmin Cho, Yongin-si (KR); Daehyun Kim, Yongin-si (KR); Sungchul Kim, Yongin-si (KR); Jonghyuk Kang, Yongin-si (KR); Keunkyu Song, Yongin-si (KR); Jooyeol Lee, Yongin-si (KR); Hyundeok Im, Yongin-si (KR); Chio Cho, Yongin-si (KR); Hyeyong Chu, Yongin-si (KR); Sungjin Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 308 days.

(21) Appl. No.: 17/460,116

(22) Filed: Aug. 27, 2021

(65) Prior Publication Data

US 2021/0391496 A1    Dec. 16, 2021

Related U.S. Application Data

(63) Continuation of application No. 16/889,123, filed on Jun. 1, 2020, now Pat. No. 11,114,582, which is a
(Continued)

(30) Foreign Application Priority Data

Jul. 12, 2016    (KR) .................. 10-2016-0088048

(51) Int. Cl.
*H01L 33/62*    (2010.01)
*H01L 25/075*    (2006.01)
(Continued)

(52) U.S. Cl.
CPC ...... *H01L 33/0075* (2013.01); *H01L 25/0753* (2013.01); *H01L 27/156* (2013.01);
(Continued)

(58) Field of Classification Search
CPC ..... H01L 33/00–0041; H01L 33/20–24; H01L 33/36–42; H01L 29/4908; H05K 1/11–189
See application file for complete search history.

(56) References Cited

U.S. PATENT DOCUMENTS 4,916,464 A * 4/1990 Ito .............................. B41J 2/45
347/237
5,739,554 A * 4/1998 Edmond ............... H01L 33/007
257/E33.049
(Continued)

FOREIGN PATENT DOCUMENTS

CN    1402880 A    3/2003
CN    1825571 A    8/2006
(Continued)

OTHER PUBLICATIONS

Extended European Search Report dated Nov. 27, 2017.
(Continued)

*Primary Examiner* — Didarul A Mazumder
*Assistant Examiner* — Gustavo G Ramallo
(74) *Attorney, Agent, or Firm* — Lewis Roca Rothgerber Christie LLP

(57) ABSTRACT

A display apparatus includes a substrate, a first electrode on the substrate, the first electrode including a first portion that has a flat upper surface and a second portion that protrudes from the first portion and has an inclined surface, a second electrode facing the first electrode in parallel on the substrate, the second electrode including a first portion that has a flat upper surface and a second portion that protrudes from
(Continued)

the first portion and has an inclined surface, and a plurality of light-emitting devices separate from each other on the first electrode and the second electrode, the light-emitting devices each having a first end contacting the upper surface of the first portion of the first electrode and a second end contacting the upper surface of the first portion of the second electrode.

14 Claims, 26 Drawing Sheets

Related U.S. Application Data continuation of application No. 15/646,590, filed on Jul. 11, 2017, now Pat. No. 10,672,946.

(51) Int. Cl.

| | | |
|---|---|---|
| *H01L 27/15* | (2006.01) | |
| *H01L 33/00* | (2010.01) | |
| *H01L 33/06* | (2010.01) | |
| *H01L 33/32* | (2010.01) | |
| *H01L 33/38* | (2010.01) | |
| *H01L 33/40* | (2010.01) | |
| *H01L 33/44* | (2010.01) | |
| *H05K 1/11* | (2006.01) | |
| *H05K 1/18* | (2006.01) | |

(52) U.S. Cl.
CPC .............. *H01L 33/06* (2013.01); *H01L 33/32* (2013.01); *H01L 33/38* (2013.01); *H01L 33/405* (2013.01); *H01L 33/44* (2013.01); *H01L 33/62* (2013.01); *H05K 1/11* (2013.01); *H05K 1/181* (2013.01); *H01L 2224/95085* (2013.01); *H01L 2933/0016* (2013.01); *H05K 2201/10106* (2013.01)

(56) References Cited

U.S. PATENT DOCUMENTS

| | | | |
|---|---|---|---|
| 6,657,236 B1 | 12/2003 | Thibeault et al. | |
| 7,282,746 B2 | 10/2007 | Lee et al. | |
| 7,381,625 B2 | 6/2008 | Xi et al. | |
| 7,442,564 B2 | 10/2008 | Andrews | |
| 7,612,385 B2 | 11/2009 | Kim et al. | |
| 7,646,044 B2 | 1/2010 | Huh et al. | |
| 7,833,813 B2 | 11/2010 | Cho et al. | |
| 8,653,547 B2 | 2/2014 | Jeong et al. | |
| 9,029,838 B2 | 5/2015 | Lim et al. | |
| 9,112,112 B2 | 8/2015 | Do et al. | |
| 9,583,549 B2 | 2/2017 | You | |
| 9,603,257 B2 | 3/2017 | Tazawa et al. | |
| 9,773,761 B2 | 9/2017 | Do | |
| 9,917,235 B2 | 3/2018 | Kim | |
| 10,672,946 B2 | 6/2020 | Cho et al. | |
| 10,985,294 B2* | 4/2021 | White | H01L 33/405 |
| 11,101,411 B2* | 8/2021 | Andrews | H01L 33/26 |
| 2004/0051110 A1 | 3/2004 | Oohata | |
| 2005/0051776 A1* | 3/2005 | Miyagi | H10K 59/131 257/72 |
| 2005/0056855 A1 | 3/2005 | Lin et al. | |
| 2006/0023451 A1 | 2/2006 | Han et al. | |
| 2007/0158838 A1* | 7/2007 | Fujii | H05K 3/3436 257/E23.06 |
| 2008/0035947 A1 | 2/2008 | Weaver, Jr. et al. | |
| 2008/0111143 A1 | 5/2008 | Ishida et al. | |
| 2008/0251381 A1 | 10/2008 | Shibata et al. | |
| 2008/0252207 A1 | 10/2008 | Yamazaki et al. | |
| 2011/0033976 A1 | 2/2011 | Di Cioccio et al. | |
| 2011/0089850 A1 | 4/2011 | Shibata et al. | |
| 2011/0254043 A1 | 10/2011 | Negishi et al. | |
| 2012/0007129 A1 | 1/2012 | Beom et al. | |
| 2012/0012881 A1* | 1/2012 | Lee | H01L 33/642 257/98 |
| 2012/0326181 A1 | 12/2012 | Shibata et al. | |
| 2013/0015482 A1 | 1/2013 | Si | |
| 2013/0049028 A1 | 2/2013 | Kim et al. | |
| 2013/0049049 A1 | 2/2013 | Choi | |
| 2013/0082271 A1 | 4/2013 | Kanegae | |
| 2013/0240855 A1 | 9/2013 | Chida et al. | |
| 2014/0124801 A1 | 5/2014 | Lee | |
| 2014/0145237 A1 | 5/2014 | Do et al. | |
| 2014/0209947 A1 | 7/2014 | Cho et al. | |
| 2015/0124455 A1 | 5/2015 | Tamura et al. | |
| 2015/0228665 A1 | 8/2015 | Kim et al. | |
| 2015/0295146 A1 | 10/2015 | Ikegami et al. | |
| 2016/0141457 A1 | 5/2016 | Ha et al. | |
| 2016/0148911 A1 | 5/2016 | Do | |
| 2016/0211245 A1 | 7/2016 | Do | |
| 2017/0294480 A1 | 10/2017 | Kwon | |
| 2017/0317228 A1 | 11/2017 | Sung | |
| 2017/0358563 A1 | 12/2017 | Cho et al. | |
| 2018/0019369 A1 | 1/2018 | Cho et al. | |
| 2019/0019930 A1 | 1/2019 | Do et al. | |
| 2019/0096858 A1 | 3/2019 | Woo et al. | |

FOREIGN PATENT DOCUMENTS

| | | | |
|---|---|---|---|
| CN | 1897319 A | | 1/2007 |
| CN | 103000823 A | | 3/2013 |
| CN | 105609521 A | | 5/2016 |
| EP | 2 546 900 A1 | | 1/2013 |
| JP | 2004-128187 A | | 4/2004 |
| JP | 2009-038125 A | | 2/2009 |
| JP | 2013-038229 A | | 2/2013 |
| KR | 10-2005-0048835 A | | 5/2005 |
| KR | 10-0592508 B1 | | 6/2006 |
| KR | 10-1014155 B1 | | 2/2011 |
| KR | 10-2012-0120377 A | | 11/2012 |
| KR | 10-2012-0122159 A | | 11/2012 |
| KR | 10-2015-0006798 A | | 1/2015 |
| KR | 10-1490758 B1 | | 2/2015 |
| KR | 10-2015-0094856 A | | 8/2015 |
| KR | 10-1672781 B1 | | 10/2016 |
| KR | 10-1711187 B1 | | 3/2017 |
| KR | 10-1713818 B1 | | 3/2017 |
| TW | 1220578 B | | 8/2004 |
| WO | WO 2012/053625 A1 | | 4/2012 |
| WO | WO 2015/005654 A1 | | 1/2015 |
| WO | WO 2016/080710 A1 | | 5/2016 |
| WO | WO 2017/123039 A1 | | 7/2017 |

OTHER PUBLICATIONS

European Office action dated Jan. 21, 2019.
Office Action issued in U.S. Appl. No. 16/154,856 by the USPTO, dated Nov. 7, 2019, 10 pages.
Chinese Office Action issued in corresponding application No. CN 201710541034.5, dated Oct. 18, 2022, 12 pages.

* cited by examiner

SELF-ALIGNED DISPLAY APPARTUS

CROSS-REFERENCE TO RELATED APPLICATIONS

This application is a continuation of U.S. patent application Ser. No. 16/889,123, filed Jun. 1, 2020, which is a continuation of U.S. patent application Ser. No. 15/646,590, filed Jul. 11, 2017, now U.S. Pat. No. 10,672,946, which claims priority to and the benefit of Korean Patent Application No. 10-2016-0088048, filed Jul. 12, 2016, the entire content of all of which is incorporated herein by reference.

BACKGROUND

1. Field

Embodiments relate to a display apparatus and a method of manufacturing the same.

2. Description of the Related Art

In general, a light-emitting diode (LED) has a high light conversion efficiency, consumes a very small amount of energy, can be used semi-permanently, and is eco-friendly. To use the LED in lighting, displays, and the like, the LED and an electrode that is capable of applying power to the LED are connected to each other.

SUMMARY

Embodiments are directed to a display apparatus, including a substrate, a first electrode on the substrate, the first electrode including a first portion that has a flat upper surface and a second portion that protrudes from the first portion and has an inclined surface, a second electrode facing the first electrode in parallel on the substrate, the second electrode including a first portion that has a flat upper surface and a second portion that protrudes from the first portion and has an inclined surface, and a plurality of light-emitting devices separate from each other on the first electrode and the second electrode, the light-emitting devices each having a first end contacting the upper surface of the first portion of the first electrode and a second end contacting the upper surface of the first portion of the second electrode.

A distance between the first electrode and the second electrode may be less than a length of each of the plurality of light-emitting devices.

An angle of the inclined surface of the second portion may range between about 30 degrees and about 60 degrees.

An angle of the inclined surface of the second portion of at least one selected from the first electrode and the second electrode may continuously change.

An angle of the inclined surface of the second portion of at least one selected from the first electrode and the second electrode may be 90 degrees.

The inclined surface of the second portion may include a first inclined surface on a side of each of the plurality of light-emitting devices and a second inclined surface on an opposite side of each of the plurality of light-emitting devices.

At least one selected from the first electrode and the second electrode may have the first inclined surface that has an angle of 90 degrees and the second inclined surface that has an angle ranging between 0 degrees and 90 degrees.

A cross-section of the second portion of at least one selected from the first electrode and the second electrode may have a semicircle shape.

A cross-section of the second portion of at least one selected from the first electrode and the second electrode may have a right-angled triangle shape.

The first portion and the second portion may have bilateral symmetry.

The display apparatus may further include a first connection electrode that contacts the first end of each of the plurality of light-emitting devices and the first electrode, and a second connection electrode that contacts the second end of each of the plurality of light-emitting devices and the second electrode.

The first connection electrode may cover at least a portion of an exposed upper surface of the first electrode, and the second connection electrode may cover at least a portion of an exposed upper surface of the second electrode.

The display apparatus may further include a thin film transistor connected to one selected from the first electrode and the second electrode, and a power line connected to one selected from the first electrode and the second electrode.

A sum of a length of the first portion of one selected from the first electrode and the second electrode and a distance between the first electrode and the second electrode may be less than a length of each of the plurality of light-emitting devices.

A height of the second portion may be equal to or greater than a diameter of each of the plurality of light-emitting devices.

Embodiments are also directed to a method of manufacturing a display apparatus, the method including forming a first conductive layer on an insulation surface, forming, by patterning the first conductive layer, a pair of a first electrode and a second electrode having first portions that have flat upper surfaces and second portions that protrude from the first portions and have inclined surfaces, applying, onto the first electrode and the second electrode, a solvent including a plurality of light-emitting devices, and aligning the plurality of light-emitting devices by assigning different electric polarities to the first electrode and the second electrode so that two ends of each of the plurality of light-emitting devices respectively contact the upper surfaces of the first portions of the first electrode and the second electrode.

An electric field may be generated between the first electrode and the second electrode due to the electric polarities assigned to the first electrode and the second electrode, and an electric field gradient at an upper corner of each of the first portions of the first electrode and the second electrode may be greater than that at a top of each of the second portions of the first and second electrodes.

A cross-section of the second portion of at least one selected from the first electrode and the second electrode may have a semicircle shape.

The method may further include forming a second conductive layer that covers the plurality of light-emitting devices and the pair of electrodes, and forming, by patterning the second conductive layer, a first connection electrode that contacts a first end of each of the plurality of light-emitting devices and the first electrode, and a second connection electrode that contacts a second end of each of the plurality of light-emitting devices and the second electrode.

The forming of the first electrode and the second electrode may include disposing, above the first conductive layer, a mask that has a gradually variable light transmittance in areas of the mask that correspond to the inclined surfaces of the second portions, and patterning the first conductive layer by using the mask.

BRIEF DESCRIPTION OF THE DRAWINGS

Features will become apparent to those of skill in the art by describing in detail example embodiments with reference to the attached drawings in which.

DETAILED DESCRIPTION

Figure 1:
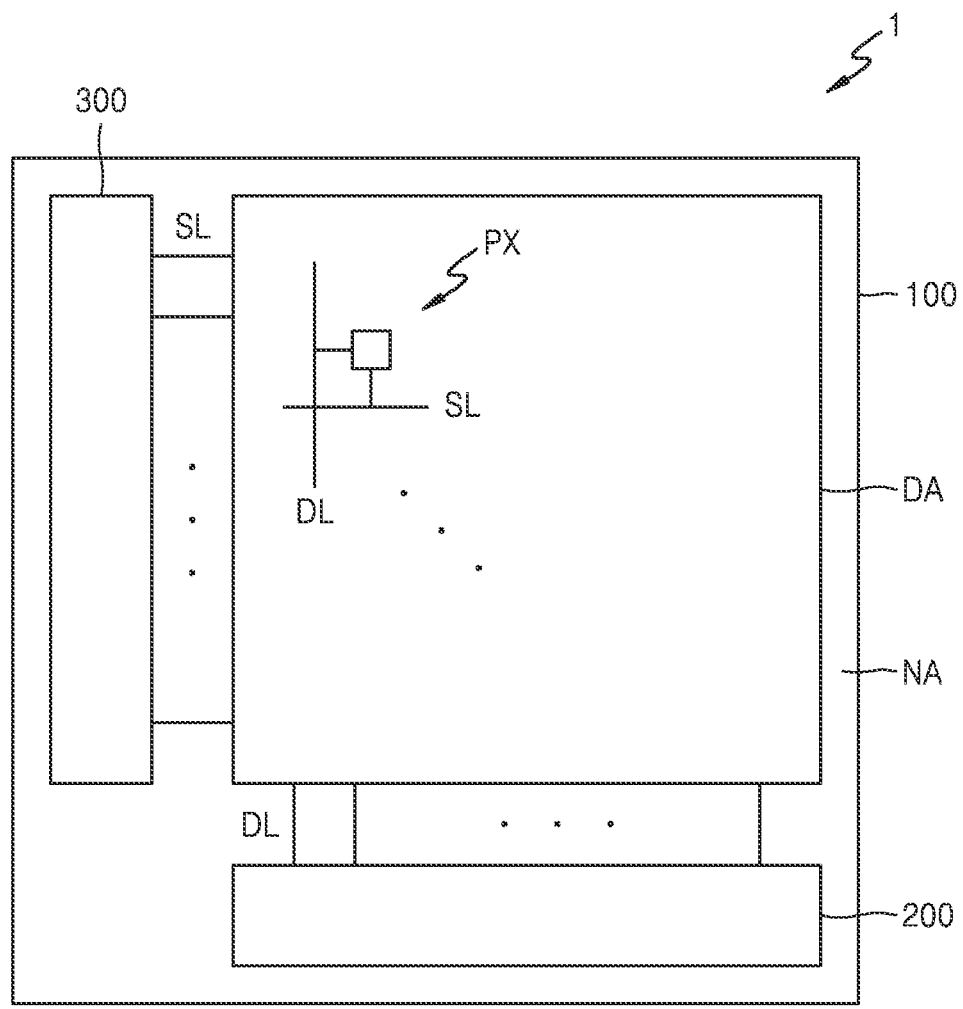
FIG. 1 illustrates a schematic plan view of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

While such terms as "first" and "second" may be used to describe various elements, such elements must not be limited to the above terms. The above terms are used only to distinguish one element from another.

It will be understood that the singular forms "a", "an", and "the" are intended to include the plural forms as well, unless the context clearly indicates otherwise.

It will be further understood that the terms such as "include", "comprise", and "have" used herein specify the presence of stated features or elements, but do not preclude the presence or addition of one or more other features or elements.

Sizes of elements in the drawings may be exaggerated for convenience of explanation. In other words, since sizes and thicknesses of elements in the drawings are arbitrarily illustrated for convenience of explanation, one or more embodiments are not limited thereto.

In the following examples, the x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

When an embodiment may be implemented differently, a specific process order may be performed differently from the described order. For example, two consecutively described processes may be performed substantially at the same time or performed in an order opposite to the described order.

The term "corresponding" or "corresponding to" used herein may refer to being disposed in or connected to the same column or row, according to the context. For example, when a first member is referred to as being connected to a "corresponding" second member from among a plurality of second members, the first member may be connected to the second member that is disposed in the same column or the same row as that of the first member.

As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic plan view of a display apparatus 1 according to an embodiment.

Referring to FIG. 1, the display apparatus 1 may include a substrate 100 that has a display area DA. A plurality of scan lines SL and a plurality of data lines DL may be arranged in the display area DA of the substrate 100. The plurality of scan lines SL are separate from each other in a predetermined direction and transmit scan signals to pixels. The plurality of data lines DL are separate from each other in a predetermined direction and transmit data signals to pixels. An extension direction of the plurality of scan lines SL may be the same as or different from an extension direction of the plurality of data lines DL. For example, the extension direction of the plurality of scan lines SL may be perpendicular to the extension direction of the plurality of data lines DL.

Pixels P may each be connected to a corresponding scan line SL and a corresponding data line DL. A plurality of pixels P may be arranged on the substrate 100 in various patterns such as a matrix form or a zigzag form. Each pixel P may emit one color, for example, one of red, blue, green, and white, or another color besides red, blue, green, and white.

A non-display area NA may be defined in an area around the display area DA, that is, a peripheral area of the display area DA. A first driver 200 and a second driver 300 may be arranged in the non-display area NA.

The first driver 200 may generate data signals and may supply the data signals to the plurality of data lines DL arranged in the display area DA.

The second driver 300 may generate scan signals and may supply the scan signals to the plurality of scan lines SL arranged in the display area DA.

The first driver 200 and the second driver 300, which are driving circuits, may be formed as integrated circuit chips and mounted on the substrate 100, or may be directly formed on the substrate 100 together when the pixels P of the display area DA are formed.

Figure 2:
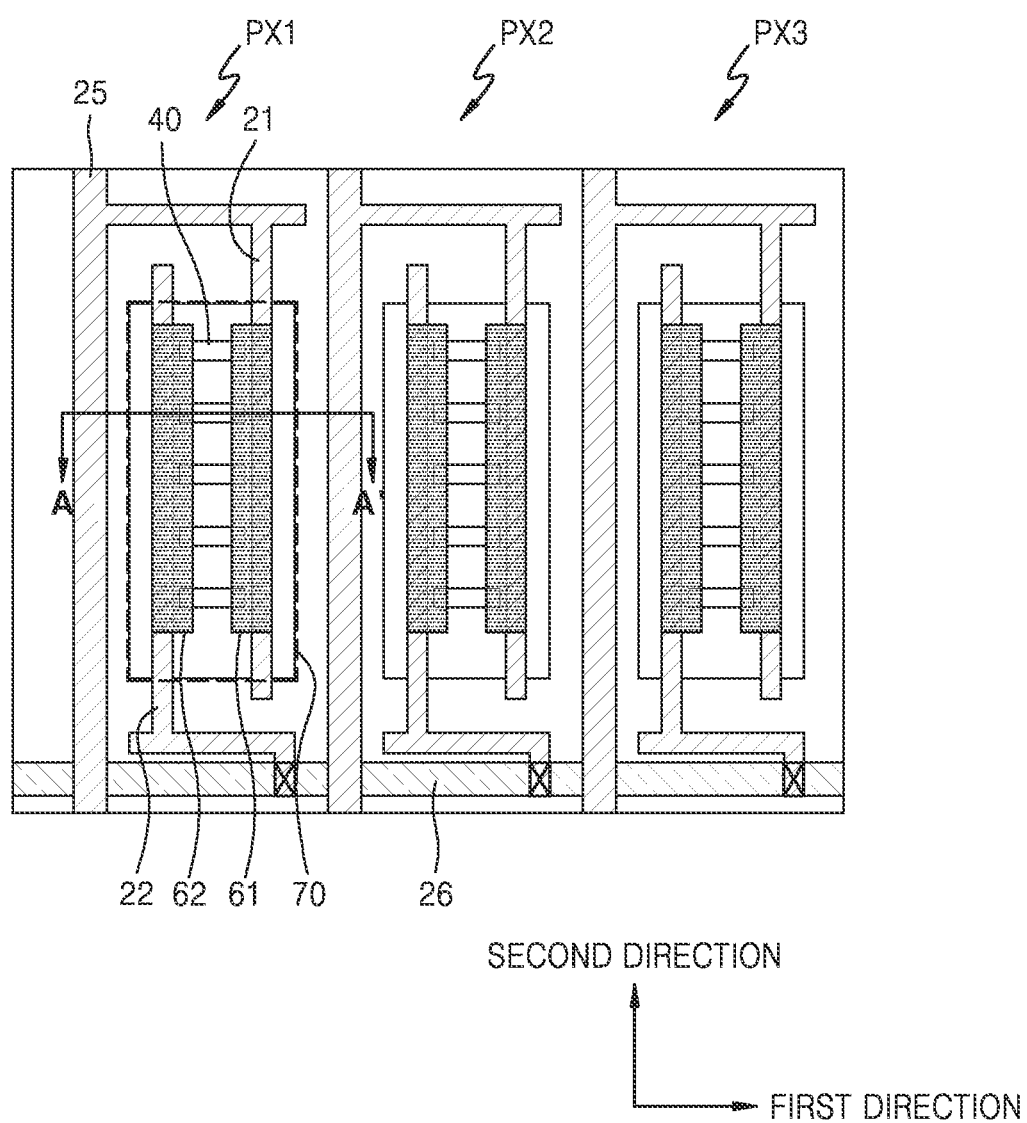
FIG. 2 illustrates a plan view of a portion of a display area according to an embodiment.
Figure 3:
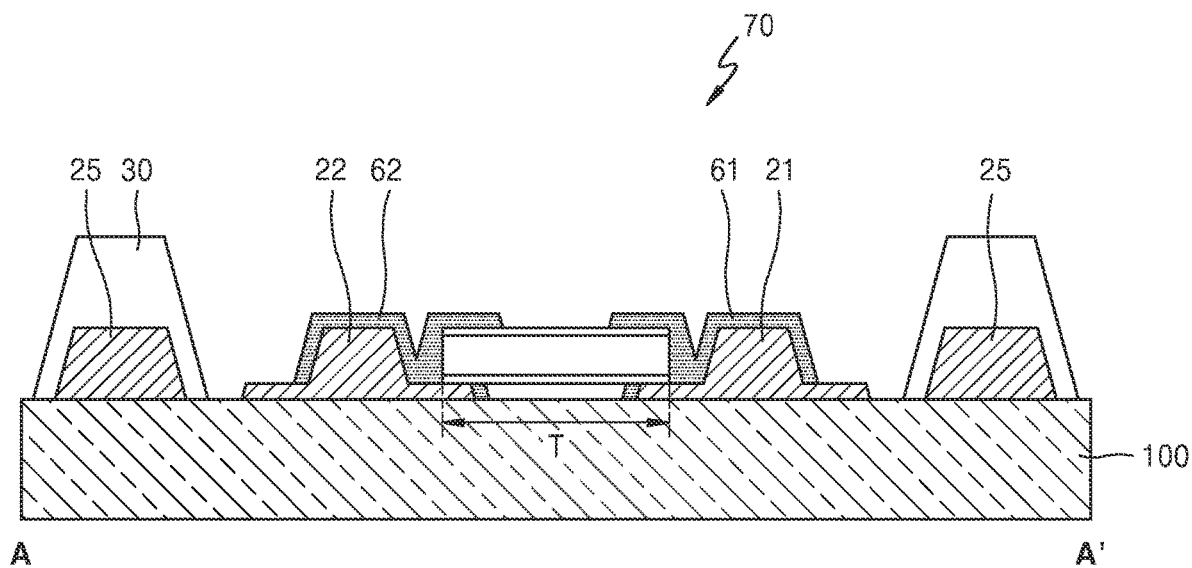
FIGS. 3 and 4 illustrate partial cross-sectional views taken along line A-A' of FIG. 2.
Figure 4:
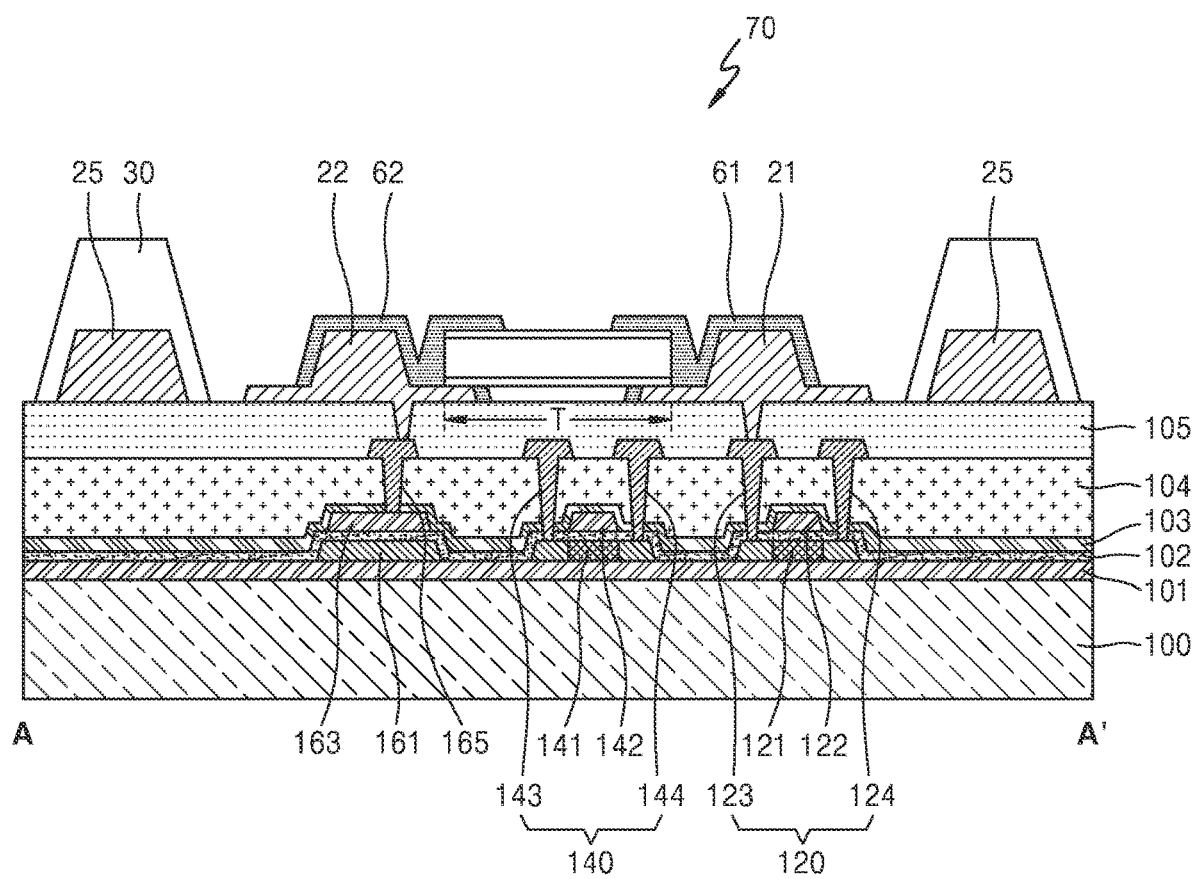

FIG. 2 is a plan view of a portion of the display area DA according to an embodiment. FIGS. 3 and 4 are partial cross-sectional views taken along line A-A' of FIG. 2. FIGS. 5A to 5D each illustrate an example of a light-emitting device according to an embodiment.

Referring to FIGS. 2 and 3 together, a first pixel PX1, a second pixel PX2, and a third pixel PX3 that emit light of different colors from each other may be arranged in the display area DA. The first pixel PX1, the second pixel PX2, and the third pixel PX3 may respectively emit, for example, red light, green light, and blue light, or any combination of colors, white light due to combination, etc. Sizes of the pixels may be the same as or different from each other.

The pixel PX1 may include a first electrode 21, a second electrode 22, and a plurality of light-emitting devices 40 electrically connected to the first electrode 21 and the second electrode 22. Similarly, the pixels PX2 and PX3 may each include a first electrode 21, a second electrode 22, and a plurality of light-emitting devices 40 electrically connected to the respective first electrode 21 and the respective second electrode 22.

Each of the plurality of light-emitting devices 40 may be a nano-sized light emitting diode (LED). The light-emitting device 40 may have various shapes such as a cylinder or a cuboid.

Figure 5A:
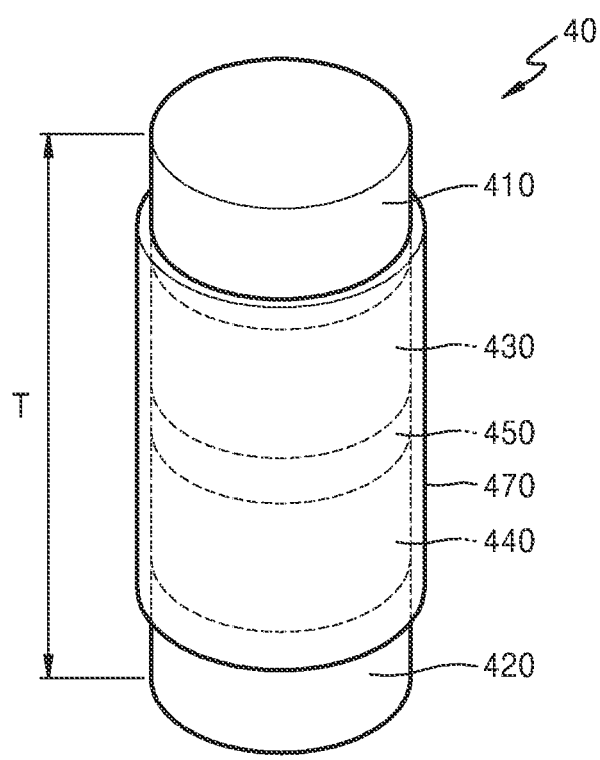
FIGS. 5A to 5D each illustrate an example of a light-emitting device according to an embodiment.

Referring to FIG. 5A, the light-emitting device 40 according to an embodiment may include a first electrode layer 410, a second electrode layer 420, a first semiconductor layer 430, a second semiconductor layer 440, and an active layer 450 between the first semiconductor layer 430 and the second semiconductor layer 440. As an example, the first electrode layer 410, the first semiconductor layer 430, the active layer 450, the second semiconductor layer 440, and the second electrode layer 420 may be sequentially stacked on one another in a length direction of the light-emitting device 40. A length T of the light-emitting device 40 may range between, for example, 1 μm and 10 μm, and a diameter of the light-emitting device 40 may range between, for example, 0.5 μm and 500 μm.

The first electrode layer 410 and the second electrode layer 420 may be ohmic contact electrodes, Schottky contact electrodes, etc. The first electrode layer 410 and the second electrode layer 420 may each include conductive metal. For example, the first electrode layer 410 and the second electrode layer 420 may each include one or more metal materials selected from a group including, for example, aluminum, titanium, indium, gold, and silver. The materials included in the first electrode layer 410 and the second electrode layer 420 may be the same as or different from each other.

The first semiconductor layer 430 may be, for example, an n-type semiconductor layer, and the second semiconductor layer 440 may be, for example, a p-type semiconductor layer. The semiconductor layers may each be selected from, for example, GaN, AlN, AlGaN, InGaN, InN, InAlGaN, and AlInN, and may be respectively doped with, for example, an n-type dopant such as Si, Ge, or Sn, a p-type dopant such as Mg, Zn, Ca, Sr, or Ba, etc. In an implementation, the first semiconductor layer 430 may include a p-type semiconductor layer, and the second semiconductor layer 440 may include an n-type semiconductor layer.

The active layer 450 may be between the first semiconductor layer 430 and the second semiconductor layer 440 and may have, for example, a single or multiple quantum well structure. The active layer 450, which is an area where electrons and holes recombine, may transition to a low energy level as electrons and holes recombine and may generate light having a wavelength that corresponds thereto. A location of the active layer 450 may be variously changed according to the LED type. In an implementation, the light-emitting device 40 may further include a fluorescent substance layer, an active layer, a semiconductor layer, and/or an electrode layer on and under the first semiconductor layer 430 and the second semiconductor layer 440.

Figure 7:
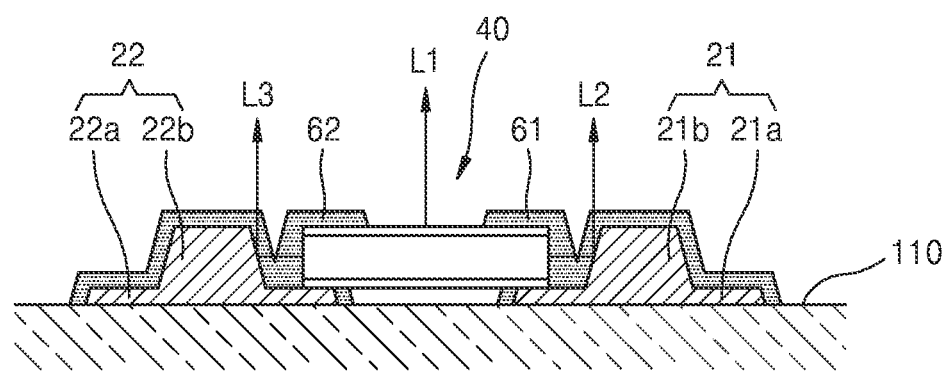

The light generated from the active layer 450 may be emitted to an external surface of the light-emitting device 40 (L1, FIG. 7) and may be emitted to both side surfaces of the light-emitting device 40 (L2 and L3, FIG. 7).

The light-emitting device 40 may further include an insulation film 470 that covers an external surface of the light-emitting device 40. As an example, the insulation film 470 may cover the active layer 450 and thus may prevent an electric short that may occur when the active layer 450 contacts the first electrode 21 or the second electrode 22. Also, the insulation film 470 may prevent degradation of luminescent efficiency by protecting the external surface including the active layer 450 of the light-emitting device 40.

Figure 5B:
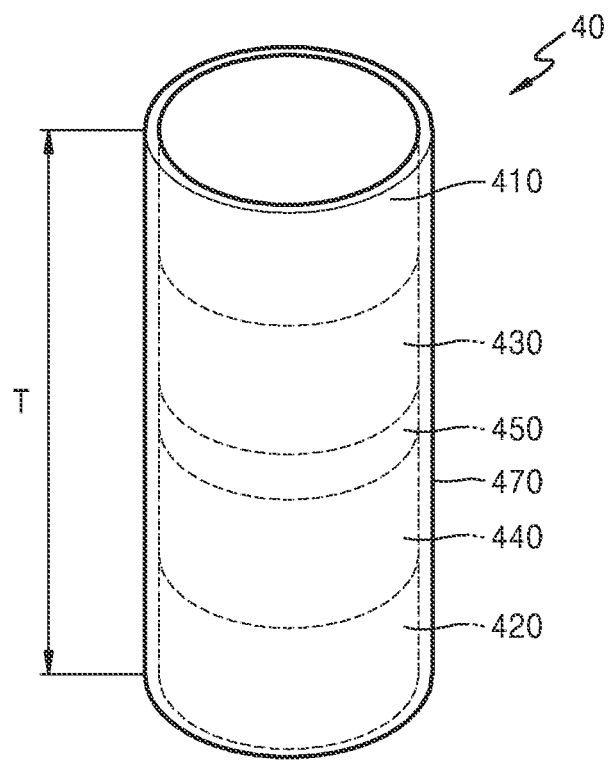

An embodiment illustrated in FIG. 5B is different from the embodiment of FIG. 5A in which the insulation film 470 covers at least the active layer 450, in that the insulation film 470 covers the entire external surface of the light-emitting device 40, and is the same as the embodiment of FIG. 5A in terms of other configurations.

Figure 5C:
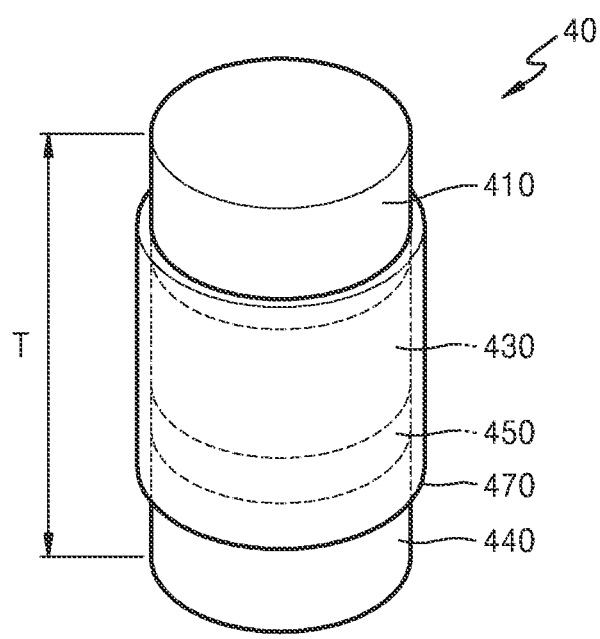

The first electrode layer 410 and/or the second electrode layer 420 of the light-emitting device 40 may be omitted. An embodiment illustrated in FIG. 5C is an example of the light-emitting device 40 having one of the first electrode layer 410 and the second electrode layer 420, for example, the second electrode layer 420, omitted from the light-emitting device 40 of FIG. 5A and including only the first electrode layer 410. In the light-emitting device 40 of FIG. 5C, the insulation film 470 covers only a portion of an external surface of the first electrode layer 410 and entirely covers an external surface of the second semiconductor layer 440. In another embodiment, the insulation film 470 may cover only a portion of the external surface of the second semiconductor layer 440.

Figure 5D:
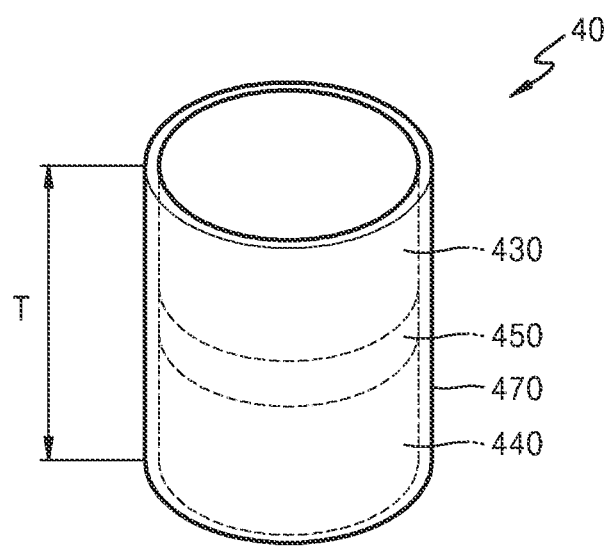

An embodiment illustrated in FIG. 5D is an example of the light-emitting device 40 having both the first electrode layer 410 and the second electrode layer 420 omitted. The insulation film 470 may cover the entire external surfaces of the first semiconductor layer 430 and the second semiconductor layer 440, or may partially cover and partially expose external surfaces of the first semiconductor layer 430 and the second semiconductor layer 440. In the embodiment of FIG. 5D, the insulation film 470 covers the entire external surfaces of the first semiconductor layer 430 and the second semiconductor layer 440.

When the insulation film 470 exposes the electrode layer or the semiconductor layer, contact areas with the first and second electrodes 21 and 22 and first and second connection electrodes 61 and 62 may increase.

The plurality of light-emitting devices 40 may each have both ends respectively contacting an upper surface of the first electrode 21 and an upper surface of the second electrode 22, and may be separate from one another on the first electrode 21 and the second electrode 22. The first electrode layer 410 or the first semiconductor layer 430 and the second electrode layer 420 or the second semiconductor layer 440, which are outermost layers of both ends of the light-emitting device 40, may respectively contact the upper surface of the first electrode 21 and the upper surface of the second electrode 22.

Although, for convenience of description, reference will now be made to the drawing in which the insulation film 470 covers the entire external surface of the light-emitting device 40, the same goes for a case in which the insulation film 470 partially exposes the outermost layers of both ends of the light-emitting device 40.

The first electrode 21 may be electrically connected to a first electrode line 25 extending in a second direction and may receive an electric signal from the first electrode line 25. The first electrode line 25 may be electrically connected to first electrodes 21 of the pixels adjacent to each other in the second direction.

The second electrode 22 may be electrically connected to a second electrode line 26 extending in a first direction perpendicular to the second direction and may receive an electric signal from the second electrode line 26. The second electrode line 26 may be electrically connected to second electrodes 22 of the pixels adjacent to each other in the first direction. The first electrode 21 and the second electrode 22 may be reversely disposed.

Figure 6:
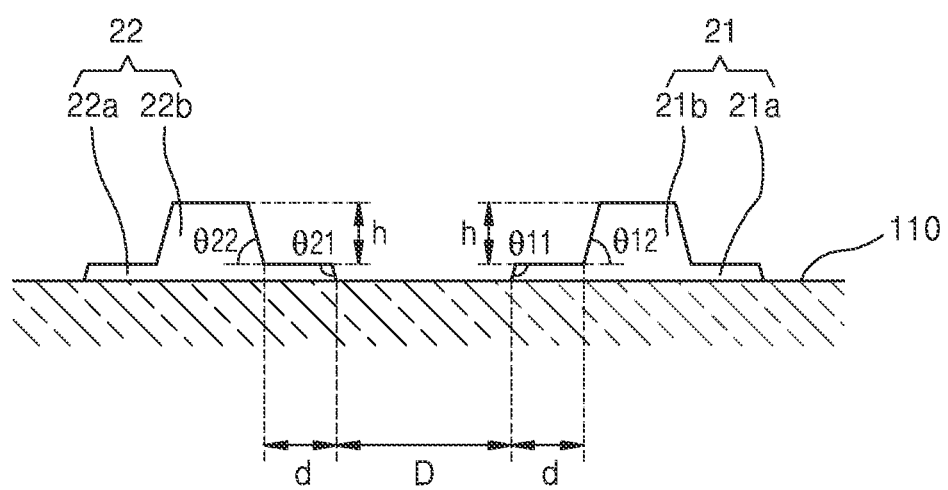
FIGS. 6 and 7 illustrate cross-sectional views of a first electrode and a second electrode according to an embodiment.

FIGS. 6 and 7 are cross-sectional views of the first electrode 21 and the second electrode 22 according to an embodiment.

Referring to FIG. 6, the first electrode 21 and the second electrode 22 may face each other in parallel on an insulation surface 110. The insulation surface 110 may be the top surface of the substrate 100 having insulating properties, as illustrated in FIG. 3, or may be the top surface of an insulation layer 105 disposed above the substrate 100, as illustrated in FIG. 4.

The first electrode 21 may include a first portion 21a having a flat upper surface that is parallel to the insulation surface 110, and a second portion 21b that protrudes from the first portion 21a and has an inclined surface. The first portion 21a may be a mounting part that the light-emitting device 40 contacts, and the second portion 21b may be a reflecting part that reflects light emitted from a side portion of the light-emitting device 40 and changes a path of the light. An angle 811 between a side surface of the first portion 21a and the upper surface at a boundary where the side surface meets the upper surface may be about 90 degrees. An angle 812 of the inclined surface of the second portion 21b may range between about 30 degrees and about 60 degrees. The angle 812 of the inclined surface may be an angle between the upper surface of the first portion 21a and an upper surface of the second portion 21b at a boundary where the upper surface of the first portion 21a meets the upper surface of the second portion 21b.

Likewise, the second electrode 22 may include a first portion 22a having a flat upper surface that is parallel to the insulation surface 110, and a second portion 22b that protrudes from the first portion 22a and has an inclined surface. An angle 821 between a side surface of the first portion 22a and the upper surface at a boundary where the side surface meets the upper surface may be about 90 degrees. An angle 822 of the inclined surface of the second portion 22b may range between about 30 degrees and about 60 degrees. The angle 822 of the inclined surface may be an angle between the upper surface of the first portion 22a and an upper surface of the second portion 22b at a boundary where the upper surface of the first portion 22a meets the upper surface of the second portion 22b.

A separation distance D between the first electrode 21 and the second electrode 22 is less than the length T of the light-emitting device 40. A sum of the separation distance D between the first electrode 21 and the second electrode 22 and a length d of the first portion 21a of the first electrode 21 or the first portion 22a of the second electrode 22 is less than the length T of the light-emitting device 40 (D+d<T), and the separation distance D is less than the length d of the first portion 21a or 22a (D<d). For example, the length d of the first portion 21a of the first electrode 21 or the first portion 22a of the second electrode 22 may be one half to one third of the length T of the light-emitting device 40. The length d of the first portion 21a of the first electrode 21 and the length d of the first portion 22a of the second electrode 22 may be the same as or different from each other. The length d of the first portion 21a or 22a is a length in the length direction of the light-emitting device 40.

Heights h of the second portion 21b of the first electrode 21 and the second portion 22b of the second electrode 22 may each be equal to or greater than the diameter of the light-emitting device 40. For example, each of the heights h of the second portion 21b of the first electrode 21 and the second portion 22b of the second electrode 22 may be two times greater than the diameter of the light-emitting device 40.

The first electrode layer 410 and/or the first semiconductor layer 430 of the light-emitting device 40 may contact the upper surface of the first portion 21a of the first electrode 21, and the second electrode layer 420 and/or the second semiconductor layer 440 may contact the upper surface of the first portion 22a of the second electrode 22.

The first electrode layer 410 or the first semiconductor layer 430 of the light-emitting device 40 may be electrically connected to the first electrode 21 via the first connection electrode 61, and the second electrode layer 420 or the second semiconductor layer 440 may be electrically connected to the second electrode 22 via the second connection electrode 62. The first connection electrode 61 may cover an exposed portion of the first electrode layer 410 or the first semiconductor layer 430 of the light-emitting device 40 and an upper surface of the first electrode 21. The second connection electrode 62 may cover an exposed portion of the second electrode layer 420 or the second semiconductor layer 440 of the light-emitting device 40 and an upper surface of the second electrode 22.

Referring to FIG. 7, light rays L2 and L3 that are emitted to both sides of the light-emitting device 40 may be respectively reflected by the inclined surfaces of the second portion 21b of the first electrode 21 and the second portion 22b of the second electrode 22, and thus, paths of the light rays L2 and L3 may be changed. The light rays L2 and L3 that have changed paths may be added to a light ray L1 that is emitted to an upper side of the light-emitting device 40, and thus, light extraction efficiency may be increased, and luminescent efficiency and luminescent intensity may be increased.

Referring to FIG. 3 again, a partition wall 30 that defines a pixel may be formed around the first electrode 21 and the second electrode 22. The partition wall 30 may cover an area except a light-emitting portion 70 where light is emitted as the plurality of light-emitting devices 40 are aligned. The partition wall 30 may cover the first electrode line 25.

As illustrated in FIG. 4, each of the pixels PX1, PX2, and PX3 may be electrically connected to the light-emitting devices 40 and may further include a pixel circuit that controls emission of the light-emitting devices 40. An embodiment illustrated in FIG. 4 further includes the pixel circuit, compared with an embodiment illustrated in FIG. 3, and is the same as the embodiment of FIG. 3 in terms of other configurations.

The pixel circuit may include at least one thin film transistor and at least one capacitor. In the embodiment of FIG. 4, a first thin film transistor 120 and a second thin film transistor 140 that are on a buffer layer 101, and a power line 163, are illustrated. The pixel circuit may have various structures. For example, the pixel circuit may include two or more thin film transistors and one or more capacitors, and thus, separate wirings may be further formed.

The first thin film transistor 120 includes a first active layer 121, a first gate electrode 122, a first drain electrode 123, and a first source electrode 124. A first gate insulation layer 102 for insulating the first gate electrode 122 and the first active layer 121 from each other may be between the first gate electrode 122 and the first active layer 121. On the first gate insulation layer 102, the first gate electrode 122 may partially overlap the first active layer 121. A second gate insulation layer 103 and an interlayer insulation layer 104 may be between the first gate electrode 122 and the first drain and source electrodes 123 and 124. The first thin film transistor 120 may be disposed on a layer below the light-emitting device 40 and may overlap or may not overlap the light-emitting device 40. The first thin film transistor 120 may be a driving thin film transistor that drives the light-emitting device 40.

The second thin film transistor 140 includes a second active layer 141, a second gate electrode 142, a second drain electrode 143, and a second source electrode 144. The first gate insulation layer 102 for insulating the second gate electrode 142 and the second active layer 141 from each other may be between the second gate electrode 142 and the second active layer 141. On the first gate insulation layer 102, the second gate electrode 142 may partially overlap the second active layer 141. The second gate insulation layer 103 and the interlayer insulation layer 104 may be between the second gate electrode 142 and the second drain and source electrodes 143 and 144. The second thin film transistor 140 may be disposed on a layer below the light-emitting device 40 and may overlap or may not overlap the light-emitting device 40. The second thin film transistor 140 may be a switching thin film transistor.

The power line 163 may be on the same layer as the first gate electrode 122 of the first thin film transistor 120 and the second gate electrode 142 of the second thin film transistor 140. The power line 163 may be electrically connected to the second electrode 22 via a connection line 165. Accordingly, the second electrode 22 may be electrically connected to the power line 163 and may receive power from the power line 163. In an implementation, an auxiliary layer 161 for reducing a step with its surroundings may be included below the power line 163.

In the aforesaid embodiment, each of the first electrode 21 and the second electrode 22 has bilateral symmetry with respect to a peak of the second portion 21b or 22b. In another implementation, an area of the upper surface of the first portion 21a or 22a may not be bilaterally symmetric.

In the aforesaid embodiment, the first connection electrode 61 and the second connection electrode 62 respectively cover only portions of exposed areas of the upper surfaces of the first electrode 21 and the second electrode 22. In another implementation, the first connection electrode 61 and the second connection electrode 62 may respectively cover at least the portions of the exposed areas of the upper surfaces of the first electrode 21 and the second electrode 22 according to external light reflection and properties of materials for the connection electrodes. For example, the first connection electrode 61 and the second connection electrode 62 may respectively cover the entire exposed areas of the upper surfaces of the first electrode 21 and the second electrode 22.

FIGS. 8A to 8K are schematic cross-sectional views of a process of manufacturing a display apparatus, according to an embodiment.

Figure 8A:
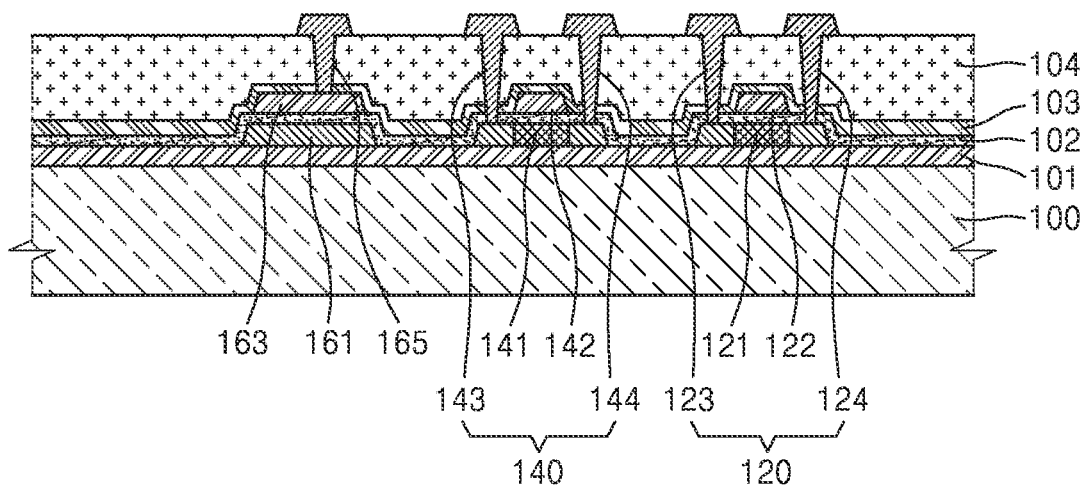
FIGS. 8A to 8K illustrate schematic cross-sectional views of a process of manufacturing a display apparatus, according to an embodiment.

Referring to FIG. 8A, a pixel circuit may be formed on the substrate 100.

The substrate 100 may include various materials, such as glass, metal, or plastic. According to an embodiment, the substrate 100 may include a flexible substrate. In this regard, the flexible substrate refers to a substrate that is twisted and bent easily and may be folded or rolled. The flexible substrate may include ultra-thin glass, metal, or plastic.

In an implementation, the buffer layer 101 may be included on the substrate 100. The buffer layer 101 may prevent intrusion of an impurity through the substrate 100, may planarize a surface of the substrate 100, and may include a layer or layers including an inorganic material such as silicon nitride ($SiN_x$) and/or silicon oxide ($SiO_x$).

The first thin film transistor 120 and the second thin film transistor 140 may be formed on the buffer layer 101.

The first thin film transistor 120 may include the first active layer 121, the first gate electrode 122, the first drain electrode 123, and the first source electrode 124. The second thin film transistor 140 may include the second active layer 141, the second gate electrode 142, the second drain electrode 143, and the second source electrode 144.

The first active layer 121 and the second active layer 141 may each be formed on the buffer layer 101 using a semiconductor material. The semiconductor material may be an inorganic semiconductor material such as amorphous silicon or polycrystalline silicon, an organic semiconductor material, an oxide semiconductor material, etc. Each of the first active layer 121 and the second active layer 141 may include a drain region and a source region that are doped with B or P ion impurities, and a channel region therebetween.

The first gate insulation layer 102 may be disposed on the buffer layer 101 and may cover the first active layer 121 and the second active layer 141. The second gate insulation layer 103 may be disposed on the first gate insulation layer 102 and may cover the first gate electrode 122 and the second gate electrode 142.

The first gate electrode 122 and the second gate electrode 142 may each be a single layer or multiple layers including, for example, at least one of aluminum (Al), platinum (Pt), lead (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu).

The first gate insulation layer 102 and the second gate insulation layer 103 may each be a layer or layers including an inorganic material. For example, the first gate insulation layer 102 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZrO_2$).

The interlayer insulation layer 104 may be included, for example, as a layer or layers including an organic material, which is on the second gate insulation layer 103. In another implementation, the interlayer insulation layer 104 may be a layer or layers including an inorganic material. In an implementation, the second gate insulation layer 103 or the interlayer insulation layer 104 may be omitted.

The first drain electrode 123, the first source electrode 124, the second drain electrode 143, and the second source electrode 144 may be formed on the interlayer insulation layer 104. The first drain electrode 123 and the first source electrode 124 may be respectively connected to the drain region and the source region of the first active layer 121 via contact holes formed in the first gate insulation layer 102, the second gate insulation layer 103, and the interlayer insulation layer 104. The second drain electrode 143 and the second source electrode 144 may be respectively connected to the drain region and the source region of the second active layer 141 via contact holes formed in the first gate insulation layer 102, the second gate insulation layer 103, and the interlayer insulation layer 104.

The first drain electrode 123, the first source electrode 124, the second drain electrode 143, and the second source electrode 144 may each include the same material as that of the first and second gate electrodes 122 and 142. The first drain electrode 123, the first source electrode 124, the second drain electrode 143, and the second source electrode 144 may include metal, alloys, metal nitrides, conductive metal oxides, transparent conductive materials, etc.

The auxiliary layer 161 may be formed on the buffer layer 101. The auxiliary layer 161 may be formed using, for example, the same material as that of the first active layer 121 and the second active layer 141, simultaneously with the first active layer 121 and the second active layer 141. In another implementation, the auxiliary layer 161 may be formed using a different material from that of the first active layer 121 and the second active layer 141, for example, by a different process from that of the first active layer 121 and the second active layer 141.

The first gate insulation layer 102 may cover the auxiliary layer 161, and the power line 163 overlapping the auxiliary layer 161 may be formed on the first gate insulation layer 102. The power line 163 may be formed, for example, using the same material as that of the first and second gate electrodes 122 and 142, simultaneously with the first and second gate electrodes 122 and 142. In another implementation, the power line 163 may be formed using a different material from that of the first and second gate electrodes 122 and 142, for example, by a different process from that of the first and second gate electrodes 122 and 142.

The second gate insulation layer 103 and the interlayer insulation layer 104 may be disposed on the power line 163, and the connection line 165 may be formed on the interlayer insulation layer 104. The connection line 165 may be electrically connected to the power line 163 via a contact hole formed in the second gate insulation layer 103 and the interlayer insulation layer 104.

Figure 8B:
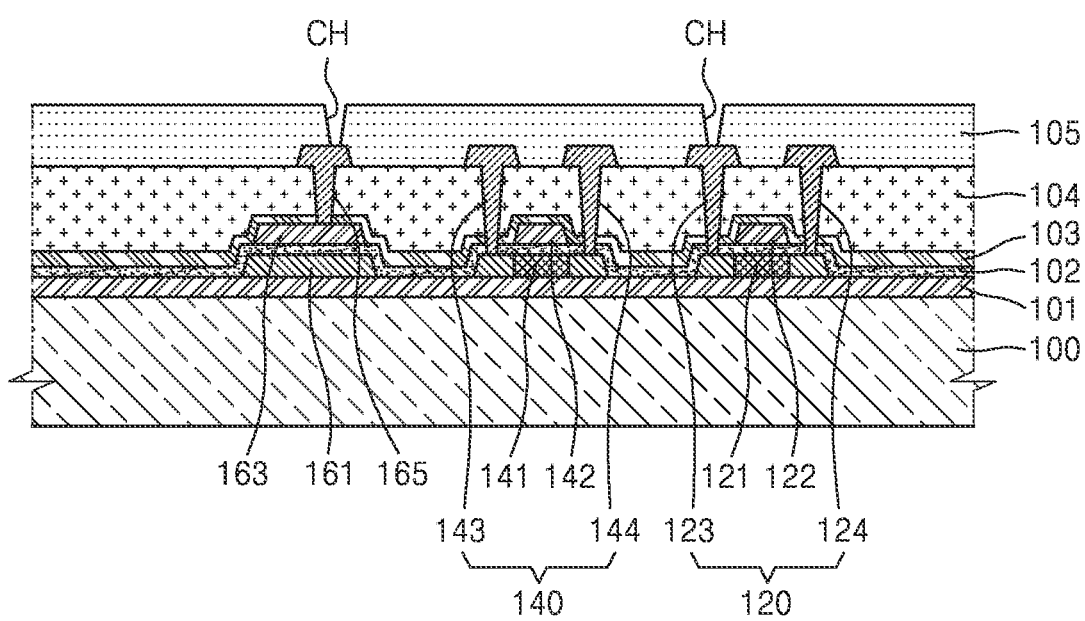

Referring to FIG. 8B, a passivation layer 105 that covers the first and second thin film transistors 120 and 140 may be formed on the interlayer insulation layer 104. The passivation layer 105 may be a layer or layers including an organic insulation material or an inorganic insulation material. In an implementation, the passivation layer 105 may be formed by alternating an organic insulation material and an inorganic insulation material.

Contact holes CH that expose a portion of the first drain electrode 123 of the first thin film transistor 120 and a portion of the connection line 165 may be formed in the passivation layer 105.

Figure 8C:
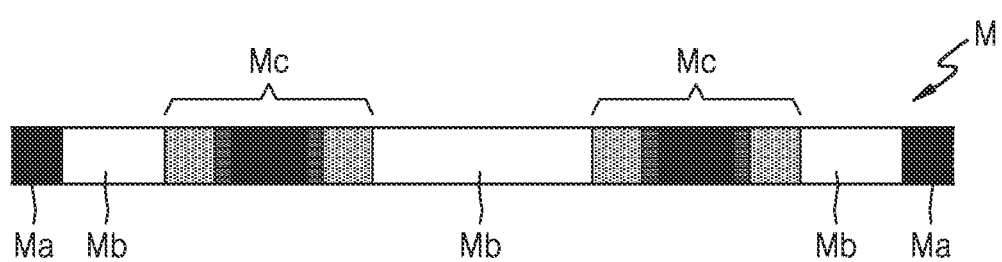
Figure 8C:
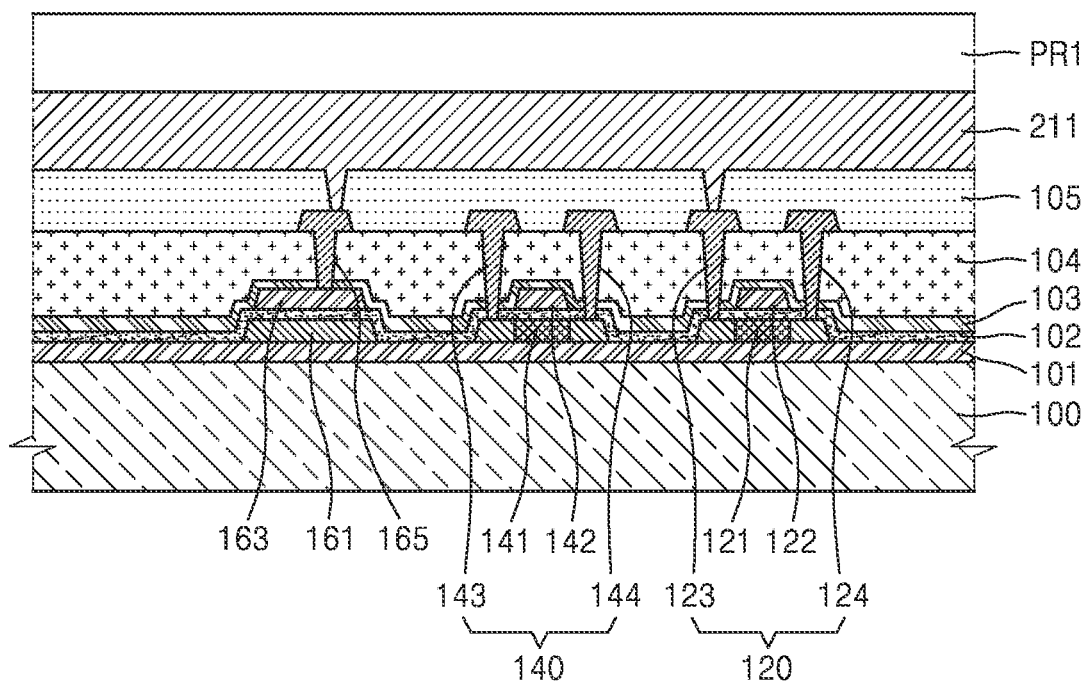

Referring to FIG. 8C, a first conductive layer 211 and a photosensitive layer PR1 may be sequentially formed on the passivation layer 105 in this stated order, and a mask M may be aligned above the substrate 100.

The first conductive layer 211 may be, for example, a transparent conductive film that includes at least one transparent conductive oxide selected from a group including indium tin oxide (ITO), indium zinc oxide (IZO), zinc oxide (ZnO), indium oxide ($In_2O_3$), indium gallium oxide (IGO), and aluminum zinc oxide (AZO). The first conductive layer 211 may include at least one metal selected from Ag, Mg, Al, Pt, Pd, Au, Ni, Nd, Ir, Cr, Li, Ca, and an alloy thereof. The first conductive layer 211 may fill the contact holes CH of the passivation layer 105.

The photosensitive layer PR1 may be a positive or negative photosensitive organic material, and in one or more embodiments, the photosensitive layer PR1 will be described as a positive photosensitive organic material.

The mask M may be a half-tone mask including a light-blocking portion Ma, a light-transmissive portion Mb, and a semi-transmissive portion Mc. The light-blocking portion Ma, the semi-transmissive portion Mc, and the light-transmissive portion Mb may be disposed respectively corresponding to an area where the partition wall 30 is formed, an area where the first electrode 21 and the second electrode 22 are formed, and the other areas. In an embodiment, the semi-transmissive portion Mc may include a light-variable portion where transmittance gradually changes, and the inclined surfaces of the first electrode 21 and the second electrode 22 may be formed by the light-variable portion where light transmittance gradationally changes.

Figure 8D:
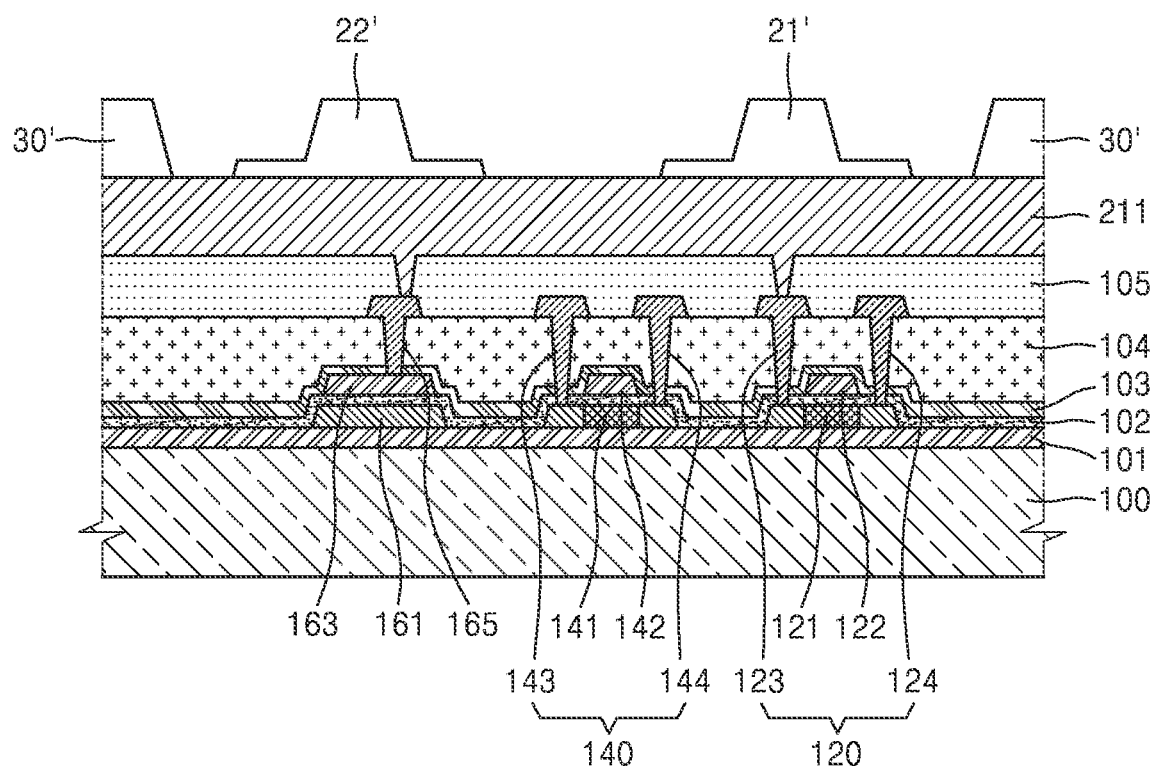

Referring to FIG. 8D, light may be irradiated on the photosensitive layer PR1 by using the mask M to perform exposure, and insulation patterns 21', 22', and 30' may be formed by developing the exposed photosensitive layer PR1.

An area of the photosensitive layer PR1 that corresponds to the light-blocking portion Ma may remain as is and form the insulation pattern 30'. An area of the photosensitive layer PR1 that corresponds to the light-transmissive portion Mb may be totally removed. An area of the photosensitive layer PR1 that corresponds to the semi-transmissive portion Mc may form the insulation patterns 21' and 22', each of which has an area where the photosensitive layer PR1 remains as is, an area where the photosensitive layer PR1 is partially removed, and an inclined area therebetween.

Figure 8E:
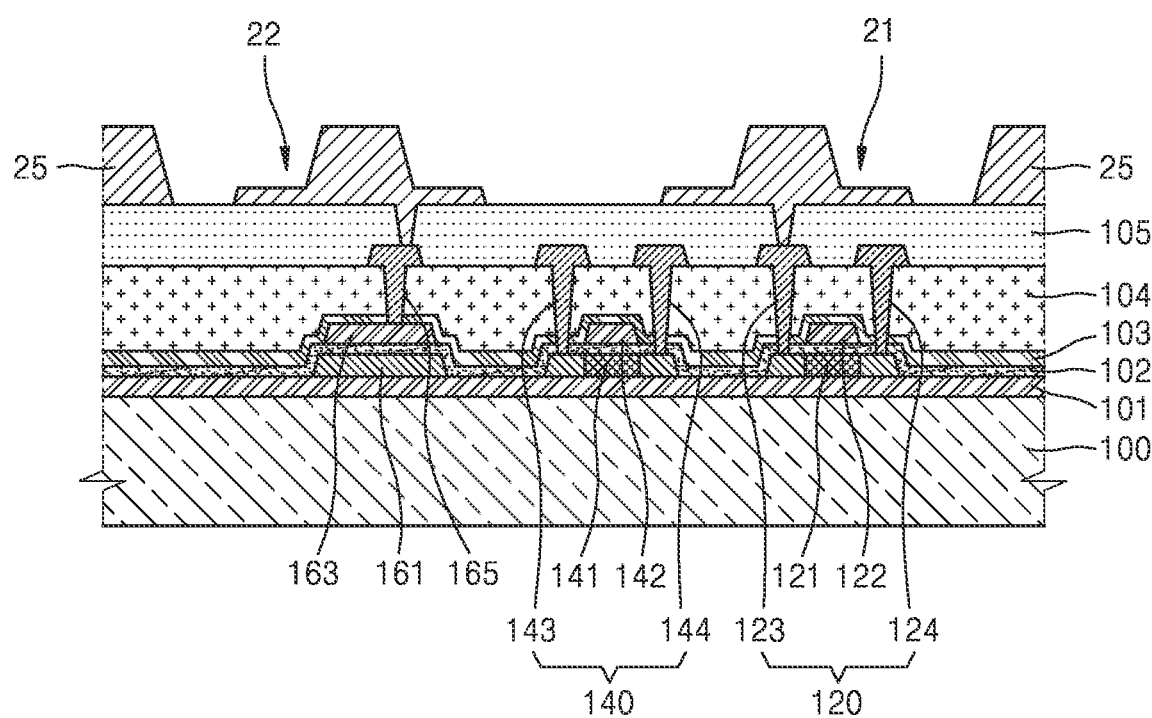

Referring to FIG. 8E, the first conductive layer 211 may be etched by using the insulation patterns 21', 22', and 30' as a mask to form the first electrode 21, the second electrode 22, the first electrode line 25.

The first electrode 21 may be electrically connected to the first drain electrode 123 of the first thin film transistor 120 that is on a layer below the first electrode 21. The second electrode 22 may be electrically connected to the power line 163 via the connection line 165 that is on a layer below the second electrode 22.

Figure 8F:
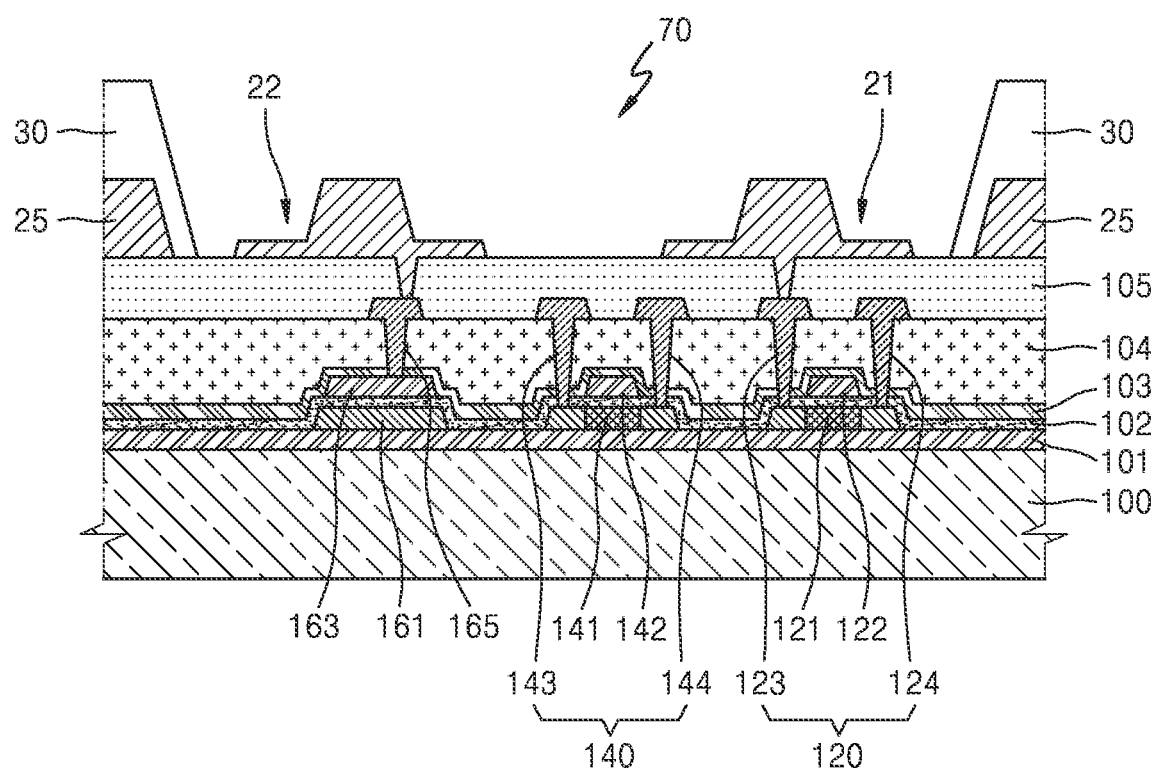

Referring to FIG. 8F, the partition wall 30 may be formed in an area except the light-emitting portion 70 that includes the first electrode 21 and the second electrode 22 where the light-emitting device 40 is to be disposed. The partition wall 30 may be patterned by forming an opening exposing the light-emitting portion 70 in an organic insulation layer formed entirely over the substrate 100.

Figure 8G:
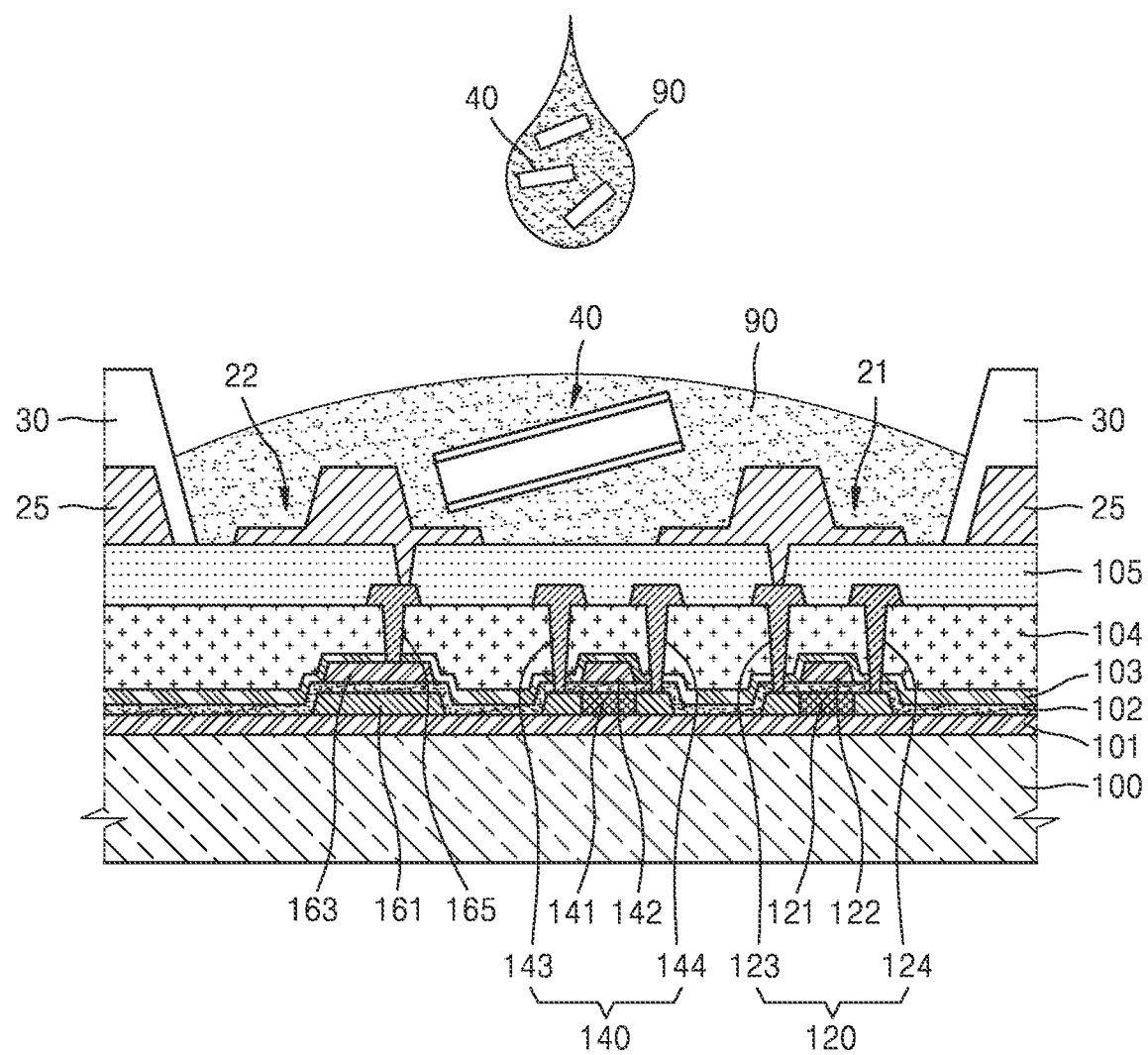

Referring to FIG. 8G, the light-emitting devices 40 may be transferred onto the first electrode 21 and the second electrode 22 by putting a solvent 90, such as ink or paste including a plurality of light-emitting devices 40, into the light-emitting portion 70. The solvent 90 may be, for example, at least one of acetone, water, alcohol, toluene, etc. For example, the solvent 90 may be any material that may be evaporated by room temperature or heat.

Figure 9:
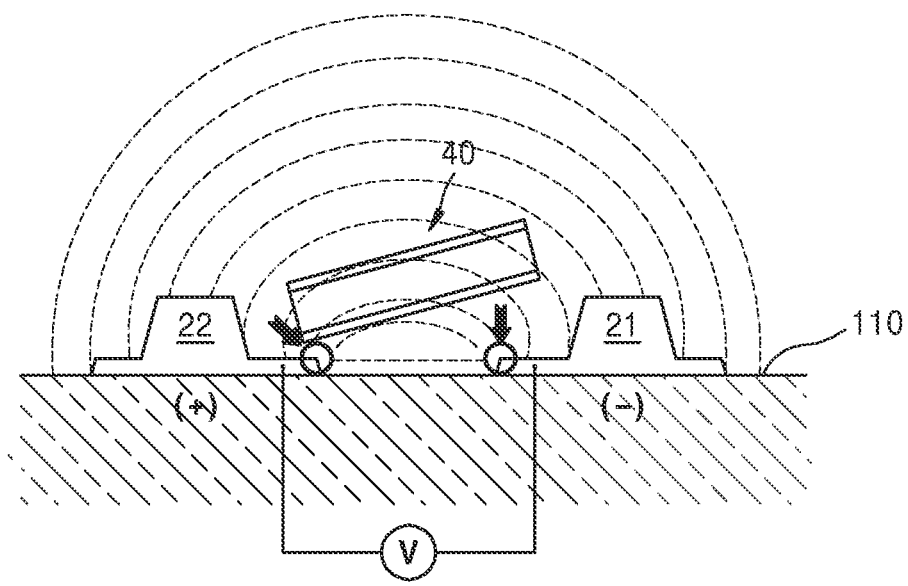
FIG. 9 illustrates an example diagram illustrating self-alignment of a light-emitting device according to an embodiment.

As illustrated in FIG. 9, an electric field E may be generated between the first electrode 21 and the second electrode 22 by applying power V across the first electrode 21 and the second electrode 22. The power V may be an external supply source or internal power of the display apparatus 1. The power V may be alternating current power that has a predetermined amplitude and cycle, or direct current power. The direct current power may be repeatedly applied to the first electrode 21 and the second electrode 22 and thus realized as power that has a predetermined amplitude and cycle.

When power is applied to the first electrode 21 and the second electrode 22, a potential difference due to electric polarities assigned to the first electrode 21 and the second electrode 22 may be generated, and thus, the electric field E may be generated. Dipolarity is induced to the light-emitting device 40 under the electric field E that is non-uniform, and a force is applied, by dielectrophoretic (DEP) force, to a side of the light-emitting device 40 where a gradient of the electric field E is large or small. Theoretically and experimentally, the DEP force strongly acted on an upper corner of each of the first portion 21a of the first electrode 21 and the first portion 22a of the second electrode 22.

Figure 8H:
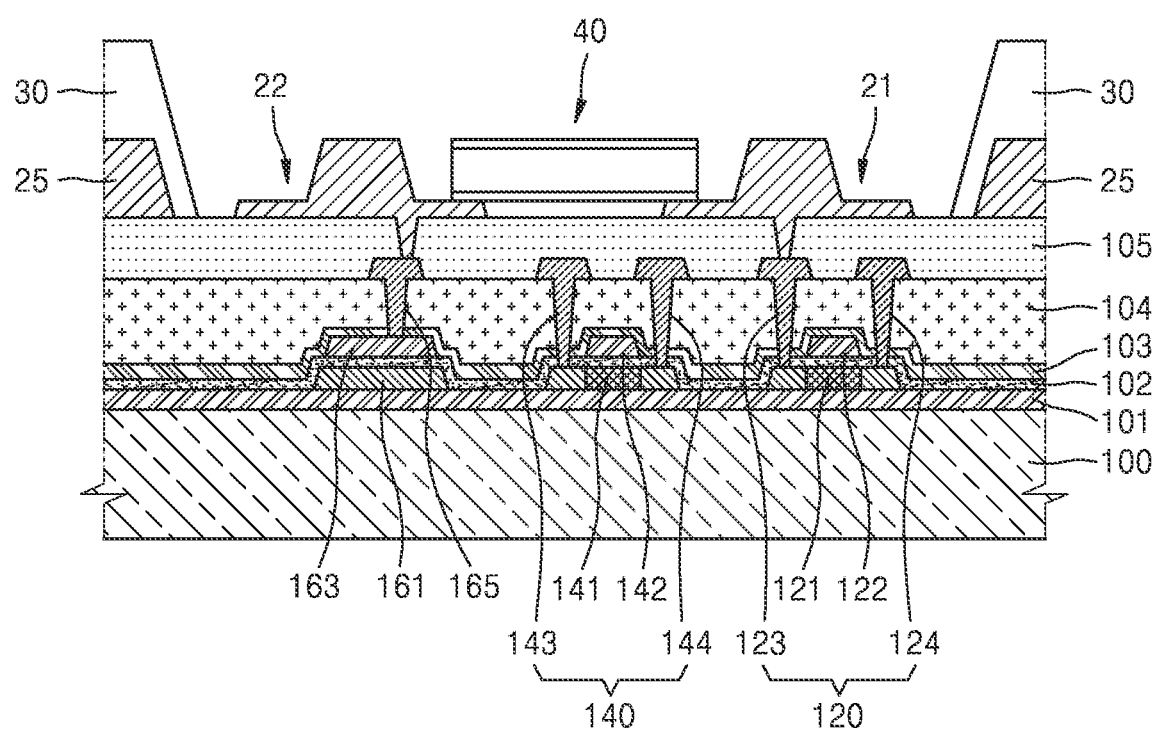

Referring to FIG. 8H, the solvent 90 may be evaporated by room temperature or heat, and the light-emitting device 40 may be self-aligned on the first electrode 21 and the second electrode 22 by the DEP force. The light-emitting device 40 may be self-aligned in such a manner that both ends of the light-emitting device 40 respectively contact an upper surface of the first portion 21a of the first electrode 21 and an upper surface of the first portion 22a of the second electrode 22.

Figure 10:
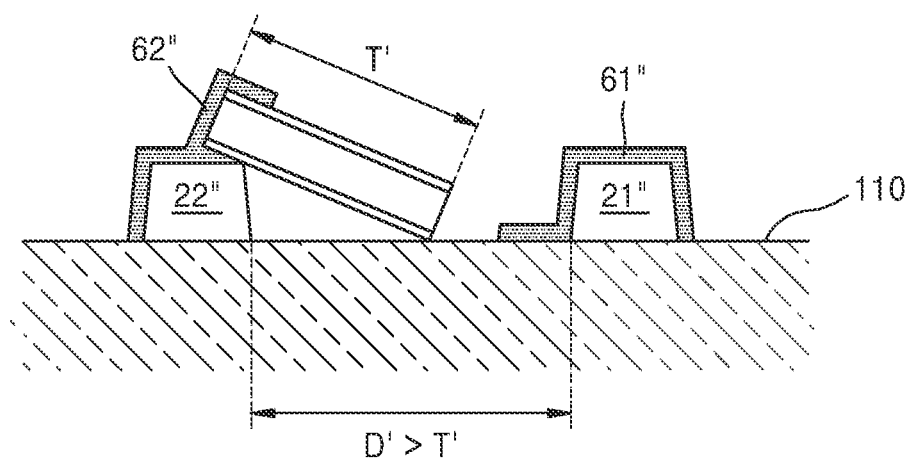
FIG. 10 illustrates a cross-sectional view of a comparative example.

Referring to the comparative example in FIG. 10, when a separation distance D' between a first electrode 21" and a second electrode 22" is greater than a length T' of a light-emitting device 40", the light-emitting device 40" may come into contact with only one of the first electrode 21" and the second electrode 22" by the DEP force, and thus, contact failure may occur.

On the other hand, in one or more embodiments, the separation distance D between the first electrode 21 and the second electrode 22 is less than the length T of the light-emitting device 40, and accordingly, self-alignment efficiency of the light-emitting device 40 may increase (refer to FIG. 6).

Figure 8I:
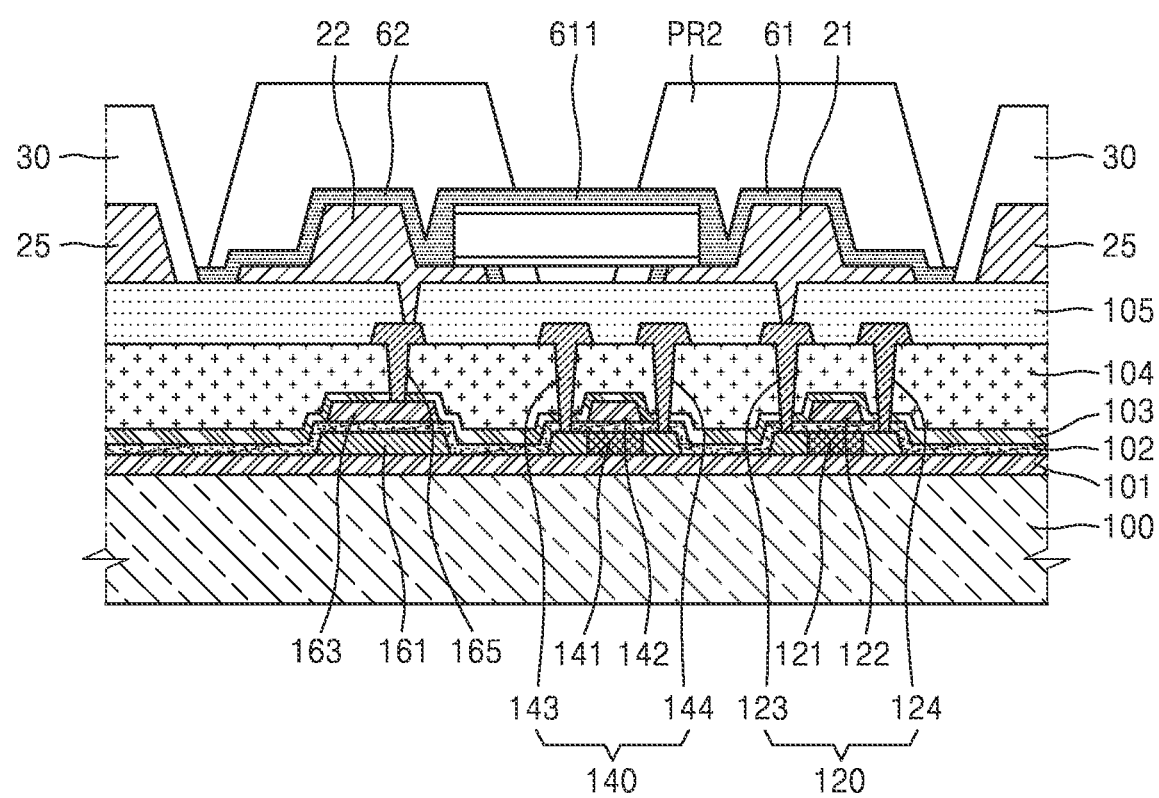

Referring to FIG. 8I, a second conductive layer 611 and a photosensitive layer PR2 may be sequentially formed in the light-emitting portion 70, and the photosensitive layer PR2 may be patterned by using a mask (not shown). The photosensitive layer PR2 may be patterned so that only an area of the second conductive layer 611 that excludes an area to be removed may remain. In another implementation, the second conductive layer 611 may be formed over the entire surface of the substrate 100, including an area around the light-emitting portion 70.

The second conductive layer 611 may be a transparent conductive film that includes at least one transparent conductive oxide selected from a group including ITO, IZO, ZnO, $In_2O_3$, IGO, and AZO. The second conductive layer 611 may be metal including Ag, Mg, Al, Pt, Pd, Au, Ni, Nd, Ir, Cr, and a compound thereof.

The photosensitive layer PR2 may be a positive or negative photosensitive organic material.

Figure 8J:
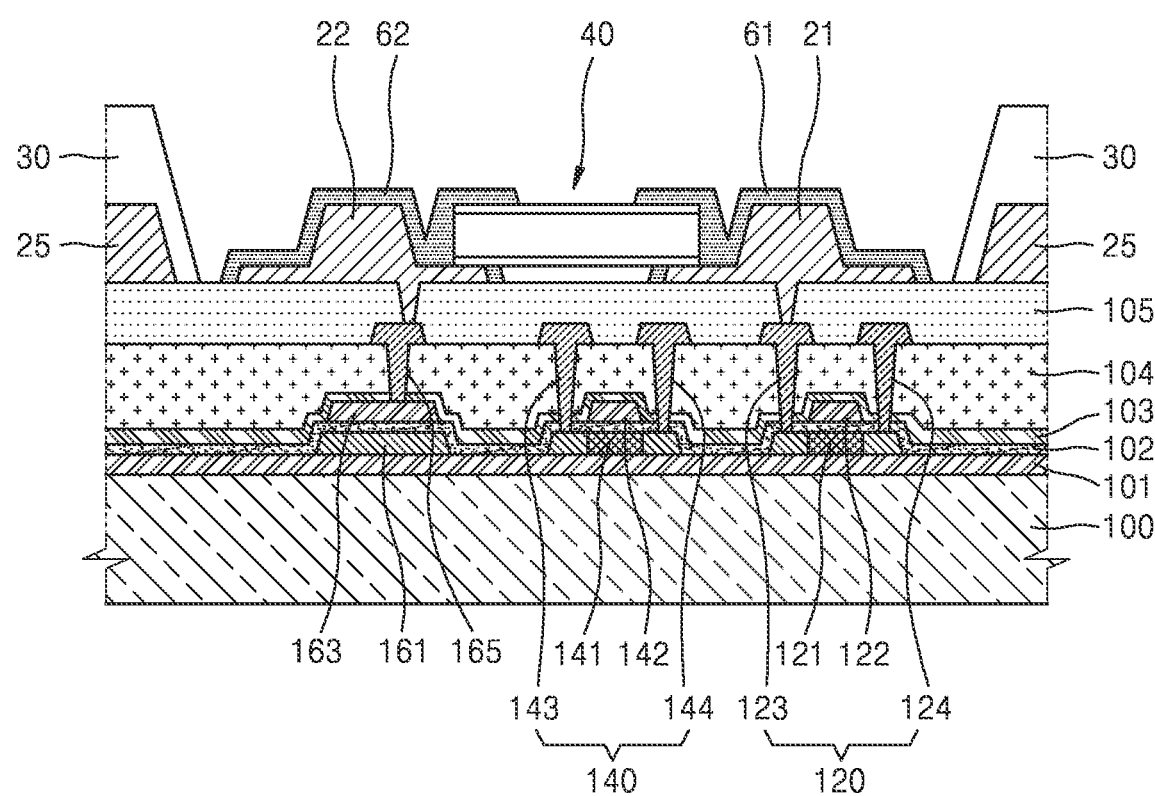

Referring to FIG. 8J, the second conductive layer 611 may be patterned by using the patterned photosensitive layer PR2 as a mask to form the first connection electrode 61 and the second connection electrode 62.

The first connection electrode 61 and the second connection electrode 62 may at least partially cover exposed areas of upper surfaces of the first electrode 21 and the second electrode 22, respectively.

The first connection electrode 61 may electrically connect one end of the light-emitting device 40 to the first electrode 21. The second connection electrode 62 may electrically connect the other end of the light-emitting device 40 to the second electrode 22.

A conductive material of the second conductive layer 611 that remains between the light-emitting device 40 and the passivation layer 105 may be removed by wet etching of the above patterning process. FIG. 8J illustrates a case in which the conductive material of the second conductive layer 611 partially remains after being removed by wet etching.

Figure 8K:
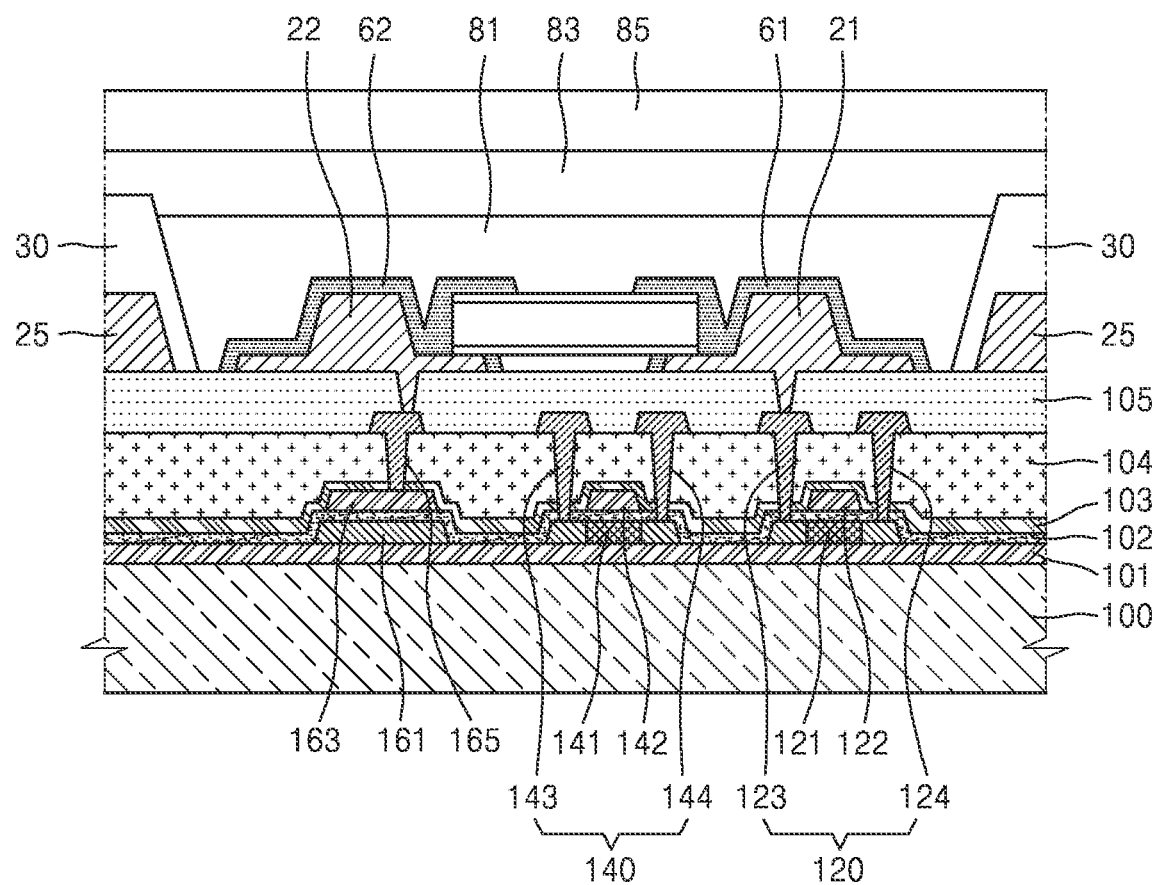

Referring to FIG. 8K, an insulation layer 81 may be formed to cover the light-emitting portion 70. The insulation layer 81 may be transparent or semi-transparent with respect to a visible wavelength and thus may prevent degradation of light extraction efficiency. The insulation layer 81 may include an organic material, for example, epoxy, poly(methyl methacrylate) (PMMA), benzocyclobutene (BCB), polyimide, polyester, etc. The insulation layer 81 may insulate the light-emitting device 40 and the passivation layer 105 from each other and thus may prevent an electric short between remaining conductive materials of the second conductive layer 611.

An optical layer 83 and a protective layer 85 may be sequentially formed on the insulation layer 81.

The optical layer 83, which may blocks external light, may be formed on the insulation layer 81. In an embodiment, the optical layer 83 may be an RGB color filter that corresponds to light that is emitted by the pixel PX. The color filter may be formed by patterning a color photoresist layer or may be formed by jetting color ink. In an embodiment, the optical layer 83 may be a polarizing plate.

The protective layer 85 may be formed on the optical layer 83. The protective layer 85 may have an encapsulating function and may be formed over the entire surface of the substrate 100. The protective layer 85 may be formed using an organic material or an inorganic material, or may be formed by alternating an inorganic material and an organic material.

FIGS. 11A to 11D are cross-sectional views each illustrating an example of the first electrode 21 and the second electrode 22 according to an embodiment. In FIGS. 11A to 11D, the left may be the first electrode 21, and the right may be the second electrode 22, or the right may be the first electrode 21, and the left may be the second electrode 22.

Figure 11A:
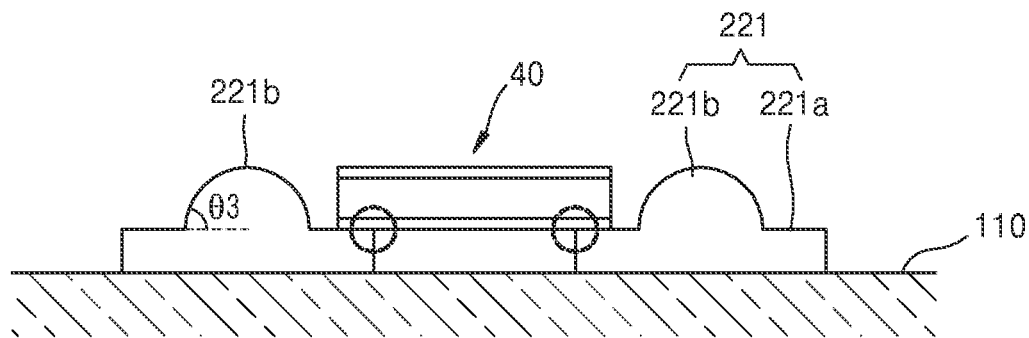
FIGS. 11A to 11D illustrate cross-sectional views each illustrating an example of a first electrode and a second electrode according to an embodiment.

Referring to FIG. 11A, each of the first electrode 21 and the second electrode 22 may include a first portion 221a and a second portion 221b that protrudes from the first portion 221a and has an inclined surface.

The first portion 221a has a flat upper surface that is parallel to the insulation surface 110. A side surface of the first portion 221a and the upper surface of the first portion 221a may form an angle of about 90 degrees at an upper corner of the first portion 221a that is a boundary where the side surface meets the upper surface. The first portion 221a and the second portion 221b may have bilateral symmetry with respect to a peak of the second portion 221b.

A cross-section of the second portion 221b has a semi-circle shape, and an angle of inclination θ3 of the inclined surface continuously changes. The angle of inclination θ3 is an angle that a tangent line touching an upper surface of the second portion 221b forms with the upper surface of the first portion 221a. The angle of inclination θ3 is 90 degrees at a boundary where the upper surface of the first portion 221a meets the upper surface of the second portion 221b. The angle of inclination θ3 is 0 degrees at the peak of the second portion 221b. The angle of inclination θ3 continuously decreases from 90 degrees to 0 degrees in a direction from the boundary where the upper surface of the first portion 221a meets the upper surface of the second portion 221b to the peak of the second portion 221b.

The second portion 221b may have a round shape, and thus a uniform electric field may be generated around the second portion 221b, and the DEP force may be concentrated on the first portion 221a. Accordingly, an effect of self-aligning the light-emitting device 40 onto the upper surface of the first portion 221a may be improved. Light that is emitted to a side surface of the light-emitting device 40 may be reflected by the second portion 221b and be extracted in an upward direction.

Figure 11B:
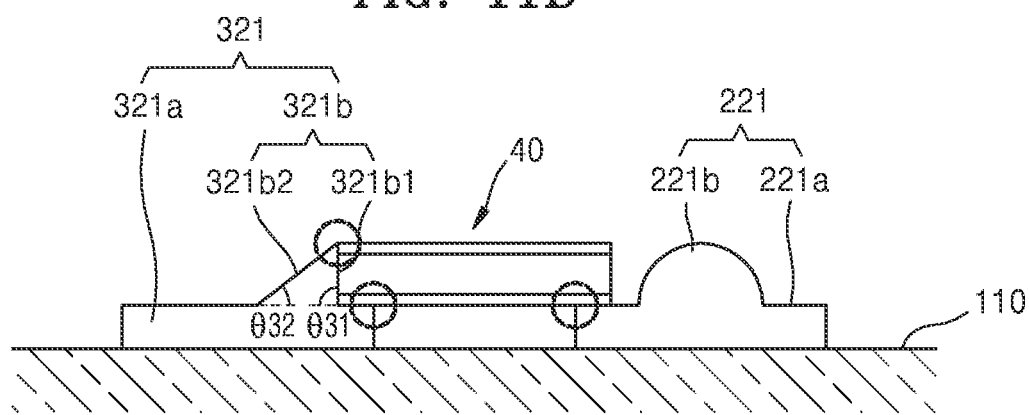

Referring to FIG. 11B, one of the first electrode 21 and the second electrode 22 may be a round-shaped electrode as illustrated in FIG. 11A, and the other may be an electrode having a sharp second portion 321b, the second portion 321b protruding from a first portion 321a. In FIG. 11B, the right may be an electrode having a round second portion, and the left may be an electrode having a sharp second portion.

The first portion 321a of the left electrode has a flat upper surface that is parallel to the insulation surface 110. A side surface and the upper surface of the first portion 321a may form an angle of about 90 degrees at an upper corner of the first portion 321a that is a boundary where the side surface meets the upper surface.

A cross-section of the second portion 321b of the left electrode may have a right-angled triangle shape, and the second portion 321b may include a first inclined surface 321b1 on a side of the light-emitting device 40 and a second inclined surface 321b2 on an opposite side of the light-emitting device 40.

An angle of inclination θ31 of the first inclined surface 321b1, which is an angle that the first inclined surface 321b1 forms with the upper surface of the first portion 321a, is 90 degrees. An angle of inclination θ32 of the second inclined surface 321b2, which is an angle that the second inclined surface 321b2 forms with the upper surface of the first portion 321a, is between 0 degrees and 90 degrees.

The DEP force is relatively large at an upper corner of the first portion 321a and at a boundary where the first inclined surface 321b1 and the second inclined surface 321b2 meet each other. Accordingly, as the DEP force may be concentrated on the left electrode rather than on the right electrode, the plurality of light-emitting devices 40 may be aligned with the left electrode. Thus, the plurality of light-emitting devices 40 may be regularly self-aligned.

Figure 11C:
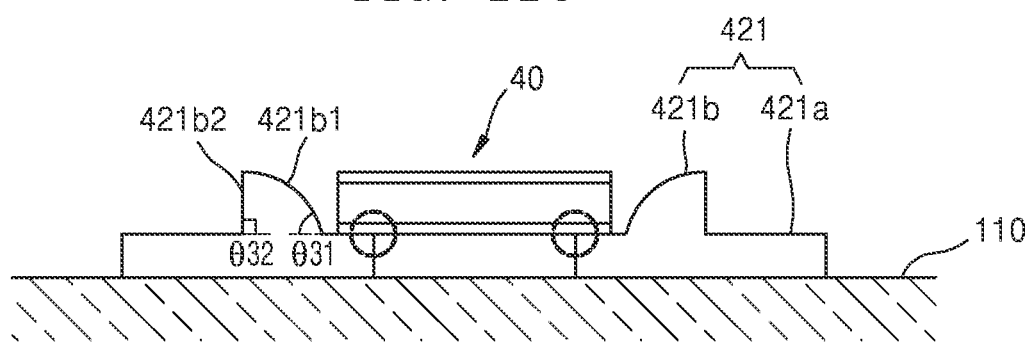

Referring to FIG. 11C, each of the first electrode 21 and the second electrode 22 may be an electrode having a partially round-shaped second portion 421b, the second portion 421b protruding from a first portion 421a.

The first portion 421a has a flat upper surface that is parallel to the insulation surface 110. A side surface and the upper surface of the first portion 421a may form an angle of about 90 degrees at an upper corner of the first portion 421a that is a boundary where the side surface meets the upper surface.

A cross-section of the second portion 421b may have a fan shape, and the second portion 421b may include a first inclined surface 421b1 on a side of the light-emitting device 40 and a second inclined surface 421b2 on an opposite side of the light-emitting device 40.

An angle of inclination θ31 of the first inclined surface 421b1 is an angle that a tangent line touching the first inclined surface 421b1 forms with the upper surface of the first portion 421a. The angle of inclination θ31 is 90 degrees at a boundary where the upper surface of the first portion 421a meets the first inclined surface 421b1. The angle of inclination θ31 is 0 degrees at the top of the first inclined surface 421b1. The angle of inclination θ31 gradually decreases from 90 degrees to 0 degrees in a direction from the boundary where the upper surface of the first portion 421a meets the first inclined surface 421b1 to the top of the first inclined surface 421b1. An angle of inclination θ32 of the second inclined surface 421b2, which is an angle that the second inclined surface 421b2 forms with the upper surface of the first portion 421a, is 90 degrees.

Light that is emitted to a side surface of the light-emitting device 40 may be reflected by the first inclined surface 421b1 of the second portion 421b and be extracted in an upward direction.

Figure 11D:
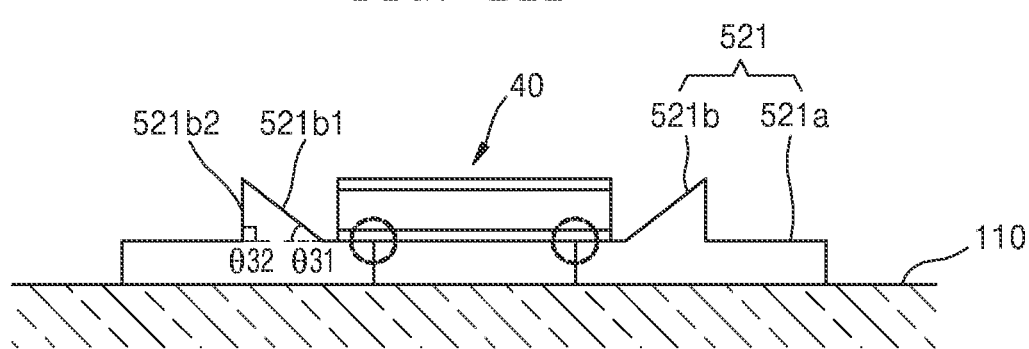

Referring to FIG. 11D, each of the first electrode 21 and the second electrode 22 may be an electrode having a sharp second portion 521b, the second portion 521b protruding from a first portion 521a.

The first portion 521a has a flat upper surface that is parallel to the insulation surface 110. A side surface and the upper surface of the first portion 521a may form an angle of about 90 degrees at an upper corner of the first portion 521a that is a boundary where the side surface meets the upper surface.

A cross-section of the second portion 521b may have a right-angled triangle shape, and the second portion 521b may include a first inclined surface 521b1 on a side of the light-emitting device 40 and a second inclined surface 521b2 on an opposite side of the light-emitting device 40.

An angle of inclination θ31 of the first inclined surface 521b1, which is an angle that the first inclined surface 521b1 forms with the upper surface of the first portion 521a, ranges between 0 degrees and 90 degrees. An angle of inclination θ32 of the second inclined surface 521b2, which is an angle that the second inclined surface 521b2 forms with the upper surface of the first portion 521a, is 90 degrees.

Light that is emitted to a side surface of the light-emitting device 40 may be reflected by the first inclined surface 521b1 of the second portion 521b and be extracted in an upward direction.

The first electrode 21 and the second electrode 22 illustrated in FIGS. 11C and 11D may have external light reflection decreased by reducing an area of inclination on the opposite side of the light-emitting device 40.

Figure 12:
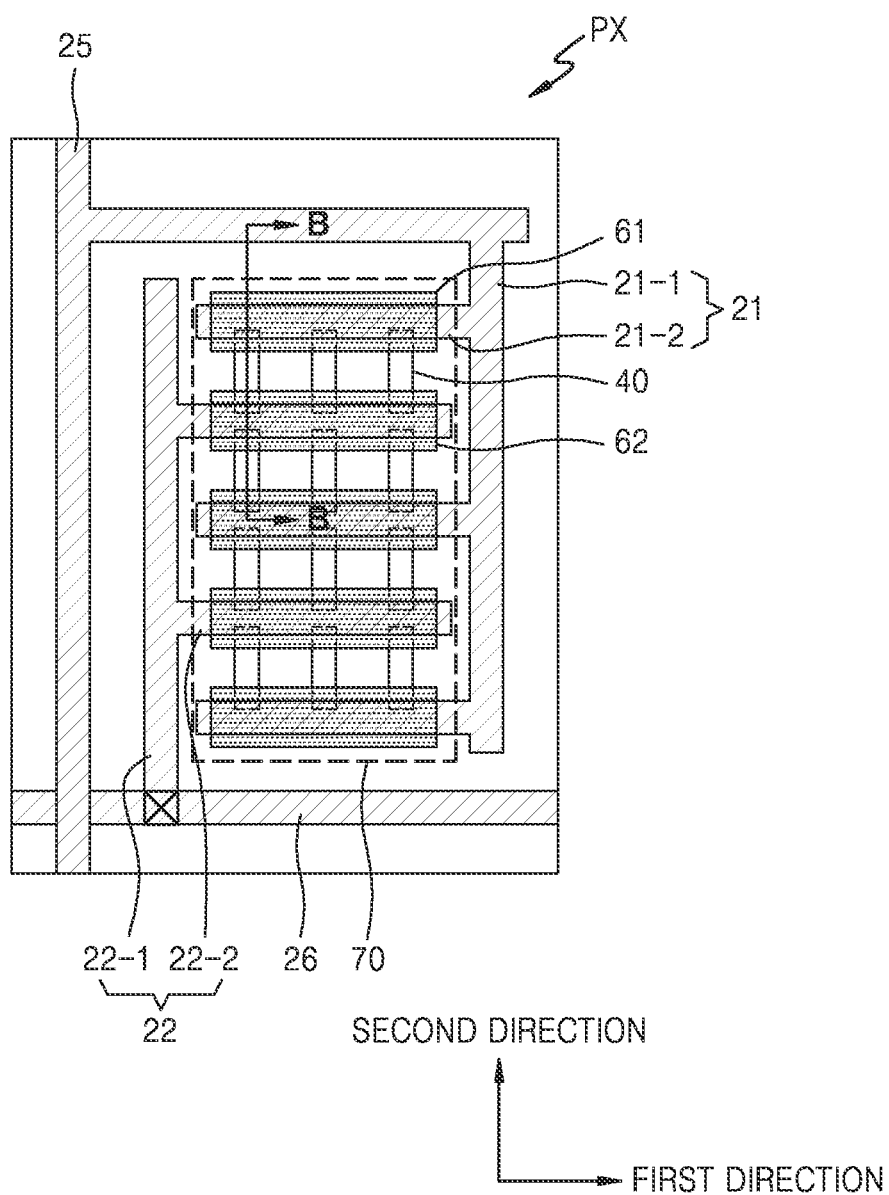
FIG. 12 illustrates a plan view of a portion of a display area according to an embodiment.
Figure 13:
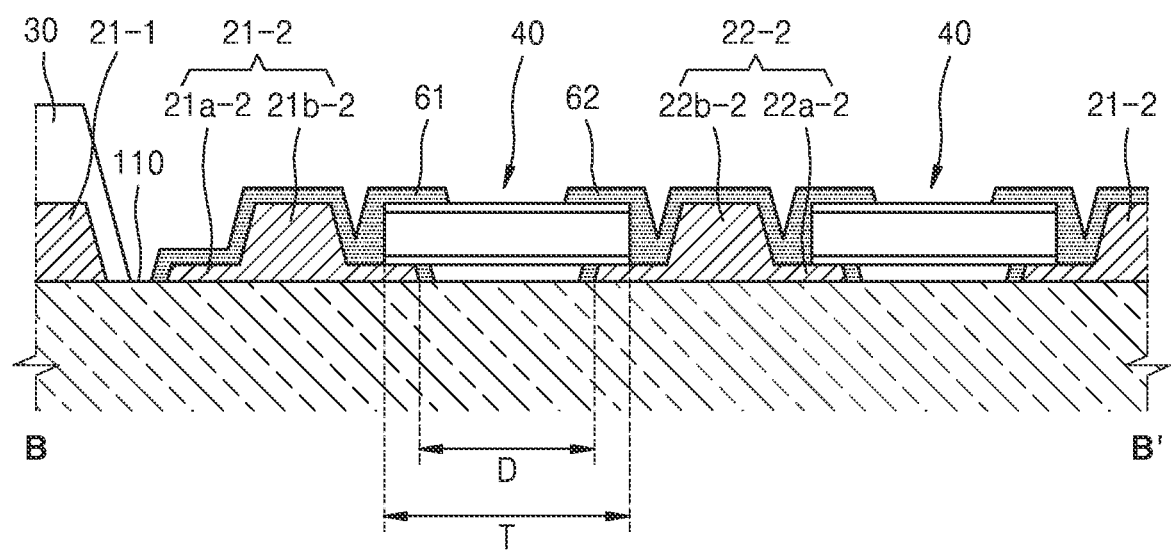
FIG. 13 illustrates partial cross-sectional view taken along line B-B' of FIG. 12.

FIG. 12 is a plan view of a portion of the display area DA according to an embodiment. FIG. 13 is partial cross-sectional view taken along line B-B' of FIG. 12. Hereinafter, differences from the aforesaid embodiments will be mainly described.

Referring to FIGS. 12 and 13, the pixel PX may be on the insulation surface 110 of the display area DA illustrated in FIG. 1. The insulation surface 110 may be the top surface of the insulating substrate 100, as illustrated in FIG. 3, or may be the top surface of the insulation layer 105 disposed above the substrate 100, as illustrated in FIG. 4.

The pixel PX may be the first pixel PX1 that emits red light, the second pixel PX2 that emits green light, or the third pixel PX3 that emits blue light. However, the disclosure is not limited thereto, and the pixel PX may emit light of another color.

The pixel PX may include the first electrode 21, the second electrode 22, and the plurality of light-emitting devices 40 electrically connected to the first electrode 21 and the second electrode 22.

The first electrode 21 may be electrically connected to the first electrode line 25 extending in a second direction and may receive an electric signal from the first electrode line 25. The first electrode line 25 may be electrically connected to the first electrodes 21 of the pixels adjacent to each other in the second direction. The first electrode 21 may include a plurality of first sub-electrodes 21-2 that have comb shapes and a first main electrode 21-1 that connects the plurality of first sub electrodes 21-2 to each other.

The second electrode 22 may be electrically connected to the second electrode line 26 extending in a first direction perpendicular to the second direction and may receive an electric signal from the second electrode line 26. The second electrode line 26 may be electrically connected to the second electrodes 22 of the pixels adjacent to each other in the first direction. The second electrode 22 may include a plurality of second sub electrodes 22-2 that have comb shapes and a second main electrode 22-1 that connects the plurality of second sub electrodes 22-2 to each other.

The plurality of first sub electrodes 21-2 and the plurality of second sub electrodes 22-2 may be arranged in the first direction while alternating with each other. The separation distance D between a first sub electrode 21-2 and a second sub electrode 22-2 is less than the length T of the light-emitting device 40.

Both ends of each of the plurality of light-emitting devices 40 respectively contact upper surfaces of first portions 21a-2 and 22a-2 of the first sub electrode 21-2 and the second sub electrode 22-2. One end of the light-emitting device 40 may be electrically connected to the first sub electrode 21-2 by the first connection electrode 61, and the other end may be electrically connected to the second sub electrode 22-2 by the second connection electrode 62.

The partition wall 30 that defines a pixel may be formed around the first electrode 21 and the second electrode 22. The partition wall 30 may cover an area excluding the light-emitting portion 70 where light is emitted as the plurality of light-emitting devices 40 are aligned. The partition wall 30 may cover the first electrode line 25, the first main electrode 21-1, and the second main electrode 22-1.

Light that is emitted to a side surface of the light-emitting device 40 may be reflected by inclined surfaces of second portions 21b-2 and 22b-2 and be extracted in an upward direction.

In the embodiment of FIGS. 12 and 13, pixels PX that emit light of the same color may share the first electrode 21 and/or the second electrode 22, and the first electrode 21 and the second electrode 22 may have bilateral symmetry. In another implementation, while the first electrode 21 and the second electrode 22 have various types of electrode structures disclosed in FIGS. 11A to 11D, the pixels PX that emit light of the same color may share the first electrode 21 and/or the second electrode 22.

In other implementations, placement and arrangement of the first electrode and the second electrode may have various layouts according to the size and density of the light-emitting devices.

According to an example embodiment, a distance between a pair of electrodes on which a light-emitting device is seated is less than a length of the light-emitting device, and each of the pair of electrodes may include a first portion on which the DEP force is concentrated and a second portion that changes, as a reflecting member, a path of light that is emitted to a side portion of the light-emitting device. Thus, the failure rate for self-alignment of the light-emitting device onto the top of the pair of electrodes may remarkably decrease, and a separate reflecting member may not be used.

In embodiments, self-alignment of light-emitting devices may be induced by using a pair of electrodes having both an electrode function and a reflection function, and thus placement and arrangement of the light-emitting devices may be concentrated on the pair of electrodes.

By way of summation and review, methods of arranging the LED and the electrode include a method of directly growing the LED, and a method of independently growing the LED separately and then arranging the LED relative to the electrode. In the latter method, when the LED is a nano-sized microminiature type, it may be difficult to arrange the LED relative to the electrode.

As described above, embodiments include a display apparatus and a method of manufacturing the same, whereby nano-sized, microminiature light-emitting devices that are independently manufactured may be aligned and connected to each other between two different electrodes, and thus, an abnormal alignment error of the microminiature light-emitting devices may be reduced or prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus comprising: a first electrode on a substrate; a second electrode on the substrate, the second electrode being opposite the first electrode; a plurality of light-emitting devices between the first electrode and the second electrode, in a plan view; a third electrode on the first electrode and electrically connecting the first electrode and a first end of each of the light-emitting devices, the third electrode extending beyond a periphery of the plurality of light-emitting devices; and a fourth electrode on the second electrode and electrically connecting the second electrode and a second end of each of the light-emitting devices, the fourth electrode extending beyond the periphery of the plurality of light-emitting devices, wherein a distance between the first electrode and the second electrode is less than a length of the plurality of light-emitting devices, and wherein an uppermost surface of the first electrode and an uppermost surface of the second electrode facing away from the substrate are above a bottom surface of the plurality of light-emitting devices facing toward the substrate.

2. The display apparatus of claim 1, further comprising
a thin film transistor comprising a semiconductor layer; and
an electrode layer electrically connecting the semiconductor layer and one of the first electrode and the second electrode.

3. The display apparatus of claim 2, wherein the semiconductor layer comprises a silicon semiconductor or oxide semiconductor.

4. The display apparatus of claim 2, further comprising a power line electrically connected to an other one of the first electrode and the second electrode.

5. The display apparatus of claim 4, further comprising an auxiliary line at a layer between the substrate and the power line.

6. The display apparatus of claim 5, wherein the auxiliary line and the semiconductor layer of the thin film transistor are at a same layer.

7. The display apparatus of claim 1, further comprising an insulation layer having an opening corresponding to the plurality of light-emitting devices on the substrate.

8. The display apparatus of claim 7, wherein the insulation layer comprises an organic material.

9. The display apparatus of claim 1, further comprising:
a first electrode line connected to the first electrode; and
a second electrode line connected to the second electrode.

10. The display apparatus of claim 9, further comprising a partition wall overlapping the first electrode line and the second electrode line.

11. The display apparatus of claim 1, wherein two sides of each of the plurality of light-emitting devices face a part of the first electrode and a part of the second electrode, respectively.

12. The display apparatus of claim 1, wherein each of the first electrode and the second electrode comprises a portion facing one of two sides of each of the plurality of light-emitting devices.

13. The display apparatus of claim 1, wherein the plurality of light-emitting devices directly contact each of the first electrode and the second electrode.

14. The display apparatus of claim 13, wherein the plurality of light-emitting devices directly contact each of the third electrode and the fourth electrode.

\* \* \* \* \*